United States Patent [19]
Maeda et al.

[11] Patent Number: 6,005,442
[45] Date of Patent: Dec. 21, 1999

[54] DIVIDER/COMBINER

[75] Inventors: Masahiro Maeda; Shigeru Morimoto, both of Osaka, Japan

[73] Assignee: Matsushita Electric Industrial Co., Ltd., Kadoma, Japan

[21] Appl. No.: 08/823,085

[22] Filed: Mar. 24, 1997

[30] Foreign Application Priority Data

Mar. 26, 1996 [JP] Japan ................................. 8-069655

[51] Int. Cl.⁶ ............................. H03F 3/68; H01P 5/12
[52] U.S. Cl. ........................ 330/295; 333/127; 333/128
[58] Field of Search ................................. 333/124, 125, 333/127, 128, 136; 330/277, 295

[56] References Cited

U.S. PATENT DOCUMENTS

| | | | |
|---|---|---|---|
| 4,547,745 | 10/1985 | Freitag et al. | 333/128 X |
| 4,875,024 | 10/1989 | Roberts | 333/127 |
| 4,901,042 | 2/1990 | Terakawa et al. | 333/127 |
| 5,126,704 | 6/1992 | Dittmer et al. | 333/128 X |
| 5,162,756 | 11/1992 | Taniguchi et al. | 333/127 X |

FOREIGN PATENT DOCUMENTS

| | | |
|---|---|---|
| 53-151343 | 5/1977 | Japan . |
| 53-049930 | 5/1978 | Japan . |
| 54-101641 | 8/1979 | Japan . |
| 57-94219 | 11/1980 | Japan . |
| 58-37220 | 9/1981 | Japan . |
| 59-057501 | 4/1984 | Japan . |
| 63-219210 | 9/1988 | Japan . |
| 1166602 | 6/1989 | Japan . |
| 1-122606 | 8/1989 | Japan . |
| 1-241202 | 9/1989 | Japan . |
| 2-081503 | 3/1990 | Japan . |
| 5-029850 | 2/1993 | Japan . |
| 5-37212 | 2/1993 | Japan ................................. 333/127 |
| 5037212 | 2/1993 | Japan . |
| 7263981 | 10/1995 | Japan . |
| 497671 | 3/1976 | U.S.S.R. . |
| 496625 | 4/1976 | U.S.S.R. . |

OTHER PUBLICATIONS

Webb, *Power Divider/Combiners:Small Size, Big Specs*, Microwaves, pp. 67–74, vol. 20, No. 12, Nov. 1981.
I. Yoshida et al., MWE '95 Microwave Workshop Digest, pp. 125–130, 1995, "UHF–Band Si Power MOSFET Amplifier For Mobile Communication."
Office Action dated Nov. 19, 1998 related to Japanese Patent Application No. 9–70179.

*Primary Examiner*—Paul Gensler
*Attorney, Agent, or Firm*—Renner, Otto, Boisselle & Sklar, P.L.L.

[57] ABSTRACT

A divider/combiner circuit for dividing or combining radio frequency power applicable to communication units utilizing a microwave band or the like. The divider/combiner circuit includes first, second and third nodes with a first transmission line electrically coupled to the first node and to the second node. In addition, the divider/combiner circuit includes a second transmission line electrically coupled to the first node and to the third node. An adjusting circuit is electrically coupled to the second node and to the third node. The adjusting circuit includes a resistance and a phase shifter. The resistance is located between points having substantially equal phases with respect to the second node and to the third node, respectively.

16 Claims, 24 Drawing Sheets

DIVIDER/COMBINER

BACKGROUND OF THE INVENTION

1. Field of the Invention

The present invention relates to a divider/combiner and more particularly to a divider/combiner for dividing or combining radio frequency power applicable to communication units utilizing a microwave band or the like.

2. Description of the Related Art

In recent years, various kinds of communication units like cellular phone units have remarkably been popularized. Reflecting such tendencies, it has become more and more necessary to further improve the performance of power dividers/combiners operating in a microwave band and power amplifiers using various kinds of semiconductor devices such as transistors and field effect transistors (FETs). In addition, researches have also been vigorously carried on for developing such units operating in a higher frequency band (i.e., a so-called "millimeter wave band"). Thanks to such rapid development, some of such units have already been used practically.

A Wilkinson type radio frequency (hereinafter abbreviated as "RF") power divider/combiner is known as a representative conventional RF power divider/combiner. FIG. 1 is an equivalent circuit diagram of a conventional Wilkinson type RF power divider/combiner. When the divider/combiner shown in FIG. 1 is used as a divider, a node 101 receives RF power and nodes 102 and 103 output the received RF power. On the other hand, when the divider/combiner shown in FIG. 1 is used as a combiner, the nodes 102 and 103 receive the RF power and the node 101 outputs the received RF power.

Herein, the impedance of a circuit connected to the node 101 will be denoted by Z1 while the impedance of circuits connected to the nodes 102 and 103 will be denoted by Z23. By setting the characteristic impedances of transmission lines 111 and 112 to be about √(2·Z1·Z23) and the lengths of the transmission lines 111 and 112 to be about λ/4, an impedance matching is realized between the divider/combiner and an external circuit connected to the divider/combiner. By providing a resistor 121 having a resistance of about 2·Z23 between the nodes 102 and 103, an electrical isolation is realized (in this specification, the expression "an isolation is realized" will always mean that an electrical isolation is realized) between the nodes 102 and 103.

The isolation between the nodes 102 and 103 is realized because the RF power passing through two paths is cancelled by each other, as will be described later. Suppose the RF power is input through the node 102 and output through the node 103. Then, one path is formed by the node 102, the transmission lines 111 and 112 and the node 103, while the other path is formed by the node 102, the resistor 121 and the node 103. Since the lengths of the transmission lines 111 and 112 are about λ/4, a phase difference between the RF power passed through one of these two paths and the RF power passed through the other path becomes about π rad at the node 103 (i.e., the phase difference is about 180°). Thus, by adjusting the resistance of the resistor 121, the RF power (input through the node 102 and passed through these two paths is cancelled at the node 103. In other words, the nodes 102 and 103 are electrically isolated from each other with respect to the RF power.

However, in accordance with conventional technologies, only a case where an impedance having a real component (i.e., a resistance component) is connected to each of the nodes 101, 102 and 103 has been considered.

On the other hand, a power amplifier described in Japanese Laid-Open Patent Publication No. 7-263981 provides a specific measure for suppressing a parasitic oscillation in a power amplifier using a power divider/combiner. In this patent publication, it is described that a gain is decreased by inserting a resistor element and a phase delay element, which are serially connected to each other, in between the two transmission lines of the power divider, thereby preventing the oscillation.

The phase delay element described in this patent publication is asymmetrically disposed with respect to the resistor element. In such an arrangement, since the phases of the RF power input to the resistor element are not the same, the resistor element consumes the power. The power amplifier described in this patent publication has a problem in that the output power and the gain of the power amplifier are disadvantageously decreased because of the power lost by the resistor element.

Furthermore, it is generally critical for an amplifier using a power divider/combiner to realize an isolation between the nodes. However, the power amplifier described in this patent publication cannot surely realize the isolation between the nodes.

FIG. 2 is an equivalent circuit diagram of a conventional Wilkinson type power divider, in which one input signal is divided into three and then output through three nodes (i.e., the division number is three). The Wilkinson type power divider shown in FIG. 2 includes: nodes 201, 202, 203 and 204; transmission lines 211, 212 and 213; and resistors 221 and 222. In order to simultaneously realize the impedance matching and the isolation, the lengths of the transmission lines 211, 212 and 213 must be set at about λ/4. Thus, the transmission line 213 must be laid out in a meander line shape. However, as the division number becomes larger, it becomes more and more difficult to lay out the transmission lines so that all of these lines have an equal length.

In the conventional Wilkinson type power divider/combiner shown in FIG. 1, as the operating frequency becomes higher, the distance between the nodes 102 and 103 becomes more and more critical so that the characteristics of the isolation between the nodes 102 and 103 are adversely deteriorated. To sum up, conventional RF power dividers/combiners have the following problems.

(1) In conventional RF power dividers/combiners, it has been difficult to simultaneously realize an impedance matching and an isolation if an impedance having an imaginary component (i.e., a reactance component) is connected to either an input node or an output node. That is to say, it is a novel idea conceptualized by the present inventors for the first time that an impedance matching and an isolation are simultaneously realized even if an impedance having a reactance component is connected to either an input node or an output node, as will be described later.

(2) In conventional power amplifiers using RF power dividers/combiners, it is difficult to realize an impedance matching and an isolation between the gate terminals thereof and similar problems are also caused between the drain terminals thereof, because the input/output impedance of a FET ordinarily has an imaginary component.

(3) In conventional power amplifiers using RF power dividers/combiners, an equal potential is provided to the gates and the nodes of a plurality of FETs. Thus, when the FETs have different threshold voltages, the output waveform becomes adversely asymmetric so that the RF power division/combination efficiency is deteriorated.

(4) In conventional RF power dividers/combiners using transmission lines, as the division (or combination) number becomes larger, it becomes more and more difficult to equalize the lengths of all the lines. Thus, when the lengths of the lines become different, the impedances cannot be matched any longer and the isolation cannot be realized satisfactorily.

(5) In conventional RF power dividers, in the case where the distance between the output nodes cannot be neglected with respect to the wavelength, the isolation between the output nodes cannot be realized satisfactorily.

SUMMARY OF THE INVENTION

According to one aspect of the invention, a divider/combiner is provided which includes: a first node; a second node; a third node; a first transmission line electrically coupled to the first node and to the second node; a second transmission line electrically coupled to the first node and to the third node; and an adjusting circuit being electrically coupled to the second node and to the third node and having a resistance and a reactance, wherein the resistance is located between points having substantially equal phases with respect to the second node and to the third node, respectively, the second node and the third node are respectively connected to an impedance having an imaginary component, and each of an electrical length of the first transmission line and an electrical length of the second transmission line has a predefined value not equal to $N\lambda/4$, where $\lambda$ is a wavelength of an operating frequency of the divider/combiner, and N is an integer, and wherein the adjusting circuit has a capacitance as the reactance and comprises a first capacitor, a first resistor and a second capacitor which are serially connected in this order.

In accordance with another aspect of the invention, a divider/combiner is provided which includes: a first node; a second node; a third node; a first transmission line electrically coupled to the first node and to the second node; a second transmission line electrically coupled to the first node and to the third node; and an adjusting circuit being electrically coupled to the second node and to the third node and having a resistance and a reactance, wherein the resistance is located between points having substantially equal phases with respect to the second node and to the third node, respectively, the second node and the third node are respectively connected to an impedance having an imaginary component, and each of an electrical length of the first transmission line and an electrical length of the second transmission line has a predefined value not equal to $N\lambda/4$, where $\lambda$ is a wavelength of an operating frequency of the divider/combiner, and N is an integer, and wherein the adjusting circuit has a capacitance as the reactance and comprises a fourth node, a first capacitor, a first resistor and a second resistor, and wherein the first capacitor and first resistor, which are serially connected to each other, connect the second node to the fourth node, and wherein the second resistor connects the third node to the fourth node.

According to yet another aspect of the invention, a divider/combiner is provided which includes: a first node; a second node; a third node; a first transmission line electrically coupled to the first node and to the second node; a second transmission line electrically coupled to the first node and to the third node; and an adjusting circuit being electrically coupled to the second node and to the third node and having a resistance and a reactance, wherein the resistance is located between points having substantially equal phases with respect to the second node and to the third node, respectively, the second node and the third node are respectively connected to an impedance having an imaginary component, and each of an electrical length of the first transmission line and an electrical length of the second transmission line has a predefined value not equal to $N\lambda/4$, where $\lambda$ is a wavelength of an operating frequency of the divider/combiner, and N is an integer, and wherein the adjusting circuit has an inductance as the reactance and comprises a first inductor, a resistor and a second inductor which are serially connected in third order.

In accordance with still another aspect of the invention, a divider/combiner is provided which includes: a first node; a second node; a third node; a first transmission line electrically coupled to the first node and to the second node; a second transmission line electrically coupled to the first node and to the third node; and an adjusting circuit being electrically coupled to the second node and to the third node and having a resistance and a reactance, wherein the resistance is located between points having substantially equal phases with respect to the second node and to the third node, respectively, the second node and the third node are respectively connected to an impedance having an imaginary component, and each of an electrical length of the first transmission line and an electrical length of the second transmission line has a predefined value not equal to $N\lambda/4$, where $\lambda$ is a wavelength of an operating frequency of the divider/combiner, and N is an integer, and wherein the adjusting circuit has a transmission line as the reactance.

According to another aspect of the invention, a divider/combiner is provided which includes: a first node; a second node; a third node; a first transmission line electrically coupled to the first node and to the second node; a second transmission line electrically coupled to the first node and to the third node; and an adjusting circuit being electrically coupled to the second node and to the third node and having a resistance and a reactance, wherein the resistance is located between points having substantially equal phases with respect to the second node and to the third node, respectively, the second node and the third node are respectively connected to an impedance having an imaginary component, and each of an electrical length of the first transmission line and an electrical length of the second transmission line has a predefined value not equal to $N\lambda/4$, where $\lambda$ is a wavelength of an operating frequency of the divider/combiner, and N is an integer, and wherein the adjusting circuit comprises a third transmission line, a first capacitor and a resistor which are serially connected to each other.

According to another aspect of the invention, a divider/combiner is provided which includes: a first node; a second node; a third node; a first transmission line electrically coupled to the first node and to the second node; a second transmission line electrically coupled to the first node and to the third node; and an adjusting circuit being electrically coupled to the second node and to the third node and having a resistance and a reactance, wherein the resistance is located between points having substantially equal phases with respect to the second node and to the third node, respectively, the second node and the third node are respectively connected to an impedance having an imaginary component, and each of an electrical length of the first transmission line and an electrical length of the second transmission line has a predefined value not equal to $N\lambda/4$, where $\lambda$ is a wavelength of an operating frequency of the divider/combiner, and N is an integer, and further comprising an amplifier for receiving a signal from at least one of the second node and the third node, amplifying the received signal and then outputting the amplified signal, wherein the amplifier comprises a plurality of amplifier elements and a plurality of nodes for supplying a gate voltage to respective gates of the plurality of amplifier elements.

In accordance with yet another aspect of the invention, a divider/combiner is provided which includes: a first node; a second node; a third node; a first transmission line electrically coupled to the first node and to the second node; a second transmission line electrically coupled to the first node and to the third node; and an adjusting circuit being electrically coupled to the second node and to the third node and having a resistance and a reactance, wherein the resistance is located between points having substantially equal phases with respect to the second node and to the third node, respectively, the second node and the third node are respectively connected to an impedance having an imaginary component, and each of an electrical length of the first transmission line and an electrical length of the second transmission line has a predefined value not equal to $N\lambda/4$, where $\lambda$ is a wavelength of an operating frequency of the divider/combiner, and N is an integer, and further comprising an amplifier for receiving a signal from at least one of the second node and the third node, amplifying the received signal and then outputting the amplified signal, wherein the amplifier comprises a plurality of amplifier elements and a plurality of nodes for supplying a drain voltage to respective drains of the plurality of amplifier elements.

Thus, the invention described herein makes possible the advantage of providing an RF power divider/combiner which can simultaneously realize a satisfactory impedance matching and isolation, and a high-efficiency RF power amplifier utilizing such a power divider/combiner.

This and other advantages of the present invention will become apparent to those skilled in the art upon reading and understanding the following detailed description with reference to the accompanying figures.

DESCRIPTION OF THE PREFERRED EMBODIMENTS

Figure 1:
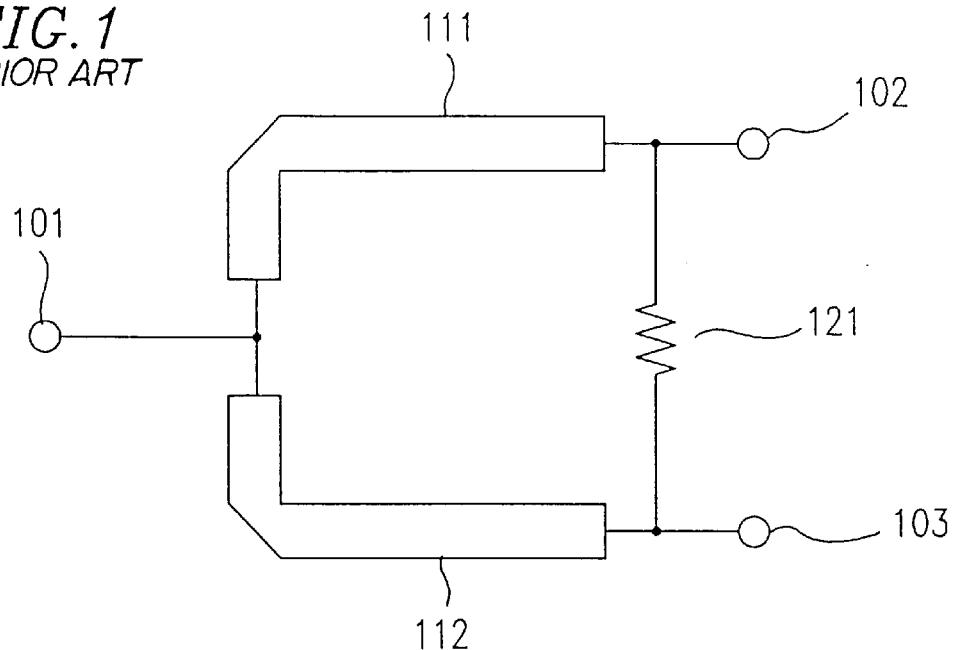
FIG. 1 is an equivalent circuit diagram of a conventional Wilkinson type RF power divider/combiner.
Figure 2:
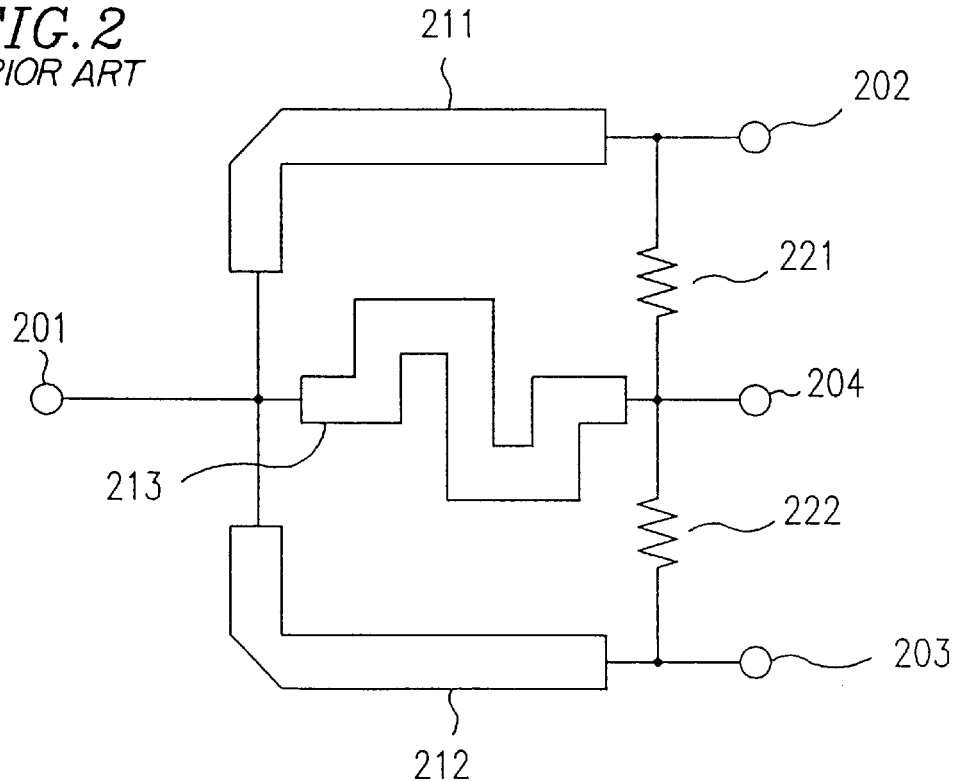
FIG. 2 is an equivalent circuit diagram of a conventional Wilkinson type RF power divider.

Hereinafter, preferred embodiments of the present invention will be described with reference to the accompanying drawings, in which the same reference numerals denote the same components.

In this specification, a "node" means a point at which a plurality of components of an electric circuit are connected to each other. Thus, the node includes a point at which a plurality of electric components are connected, an input/output terminal and the like. Herein, the node is not always required to be a "terminal", a "test pin" or the like having a physical size. In other words, a point existing within a circuit pattern laid out on a printed circuit board is also included within the scope of the term "node" of the present specification.

A "divider/combiner" is herein used as a general term of a divider and/or a combiner. As will be apparent from the following description, the divider/combiner of the present invention can be used either as a divider or as a combiner by specifying the input/output nodes. thus, in this specification, the description about a divider is also applicable to a combiner if a signal transmission direction along a path is reversed.

Furthermore, in this specification, a "transmission line" refers to a line having a length and a characteristic impedance determining the characteristics of an entire circuit. The transmission lines include microstrip lines, coplanar lines, coaxial lines, waveguides and the like. In the drawings, the transmission line is depicted as an elongate rectangle. On the other hand, a portion depicted as a solid line in the drawings is a so-called "lead", the physical length and the resistance value of which are herein neglected. In the divider/combiner of the present invention, a microstrip line or a coplanar line is preferably used as the transmission line.

The divider/combiner of the present invention is useful for dividing and/or combining power in a high frequency band, e.g., in a gigahertz band, in particular. However, the frequency used is not limited thereto.

EXAMPLE 1

Figure 3:
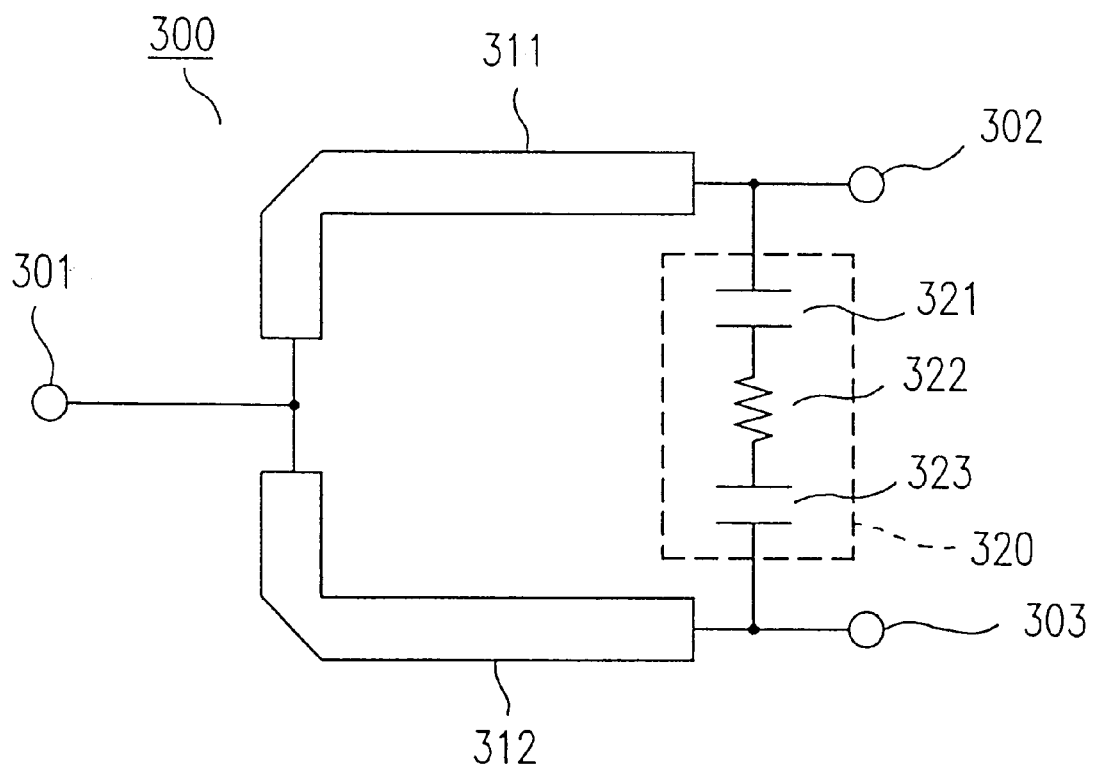
FIG. 3 is a circuit diagram of a divider/combiner in the first example of the present invention.

FIG. 3 is a circuit diagram of a divider/combiner in the first example of the present invention. The divider/combiner 300 includes nodes 301, 302 and 303. A transmission line 311 electrically couples the node 301 to the node 302, while a transmission line 312 electrically couples the node 301 to the node 303. A phase shifter 320 electrically couples the node 302 to the node 303.

When the divider/combiner 300 is used as a divider, the node 301 receives an RF signal and the nodes 302 and 303 output the received RF signal. Conversely, when the divider/combiner 300 is used as a combiner, the nodes 302 and 303 receive an RF signal and the node 301 outputs the received RF signal.

The configuration of the divider/combiner 300 is different from that of the conventional power divider/combiner at least on the following two points, as will be described in detail later. Specifically, the configuration of the divider/combiner 300 is different from that of the above-cited conventional power divider/combiner described in Japanese Laid-Open Patent Publication No. 7-263981 in that: (1) the distributions of the resistances and the reactances viewed from a plurality of output nodes are the same (i.e., in the below-described terms, a "resistance/reactance symmetry" is satisfied), and is different from the power divider/combiner shown in FIG. 1 in that: (ii) the phase shifter 320 has a reactance component. The feature (i) prevents a resistor 322 from consuming power. Moreover, even when the "resistance/reactance symmetry" is not satisfied, if the resistor 322 is disposed between points having substantially equal phases with respect to the nodes 302 and 303, the phases of the power input to the resistor 322 become the same. Consequently, the resistor 322 can be kept from consuming power.

In addition, owing to the feature (ii), even when the lengths of the transmission lines 311 and 312 are not about λ/4 (herein, λ denotes a wavelength of an RF signal used), the nodes 302 and 303 can be electrically isolated from each other.

Hereinafter, the "symmetry" of the phase shifter 320 will be described. In this example, the phase shifter 320 includes a capacitor 321, a resistor 322 and a capacitor 323 which are serially connected in this order to each other. In the divider/combiner 300, the distributions of the resistance and the reactance viewed from the node 302 are substantially equal to the distributions of the resistance and the reactance viewed from the node 303. In this specification, the "distributions" of a resistance and a reactance refer to the resistance components and the reactance components which are accumulated along a path through which an RF signal passes.

Figure 4:
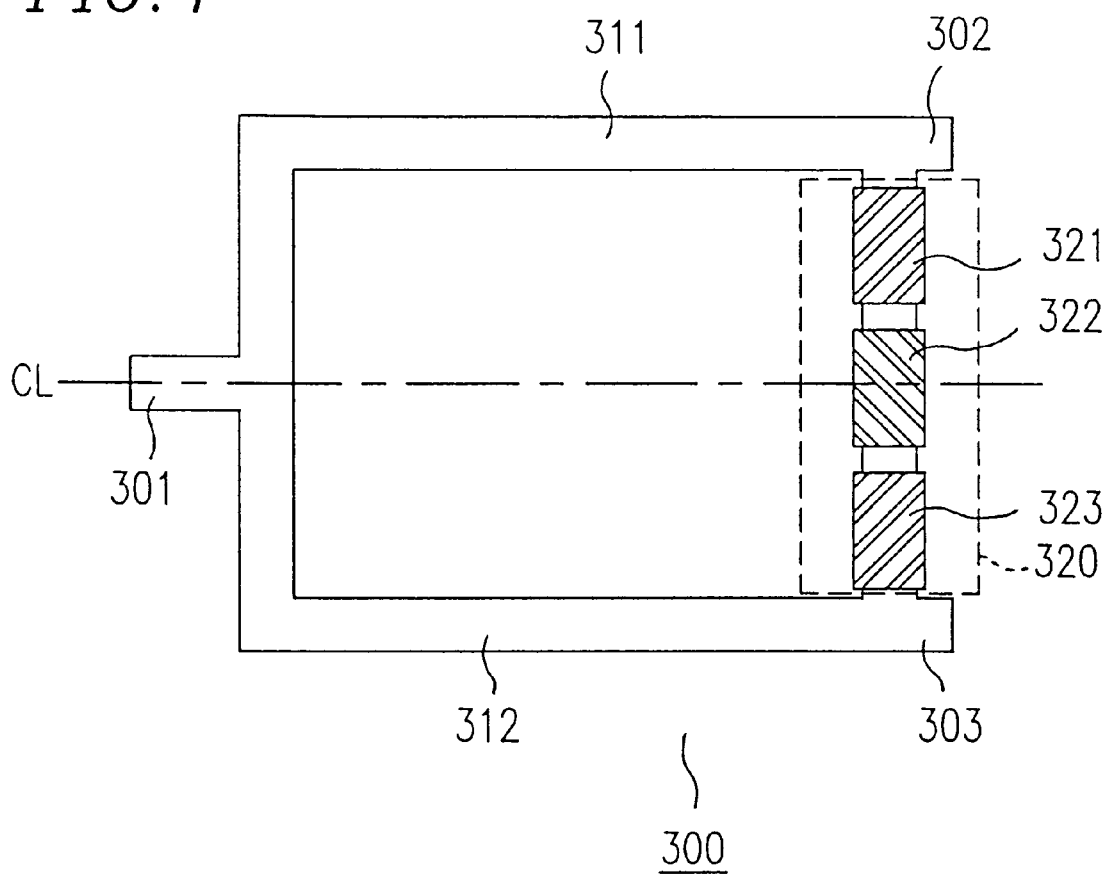
FIG. 4 is a diagram showing a circuit board configuration of the divider/combiner 300 in the first example of the present invention.

FIG. 4 is a diagram showing a circuit board configuration of the divider/combiner 300. As shown in FIG. 4, the respective components of the divider/combiner 300 are line symmetrically arranged with respect to the line passing the node 301 and the resistor 322.

Figure 5:
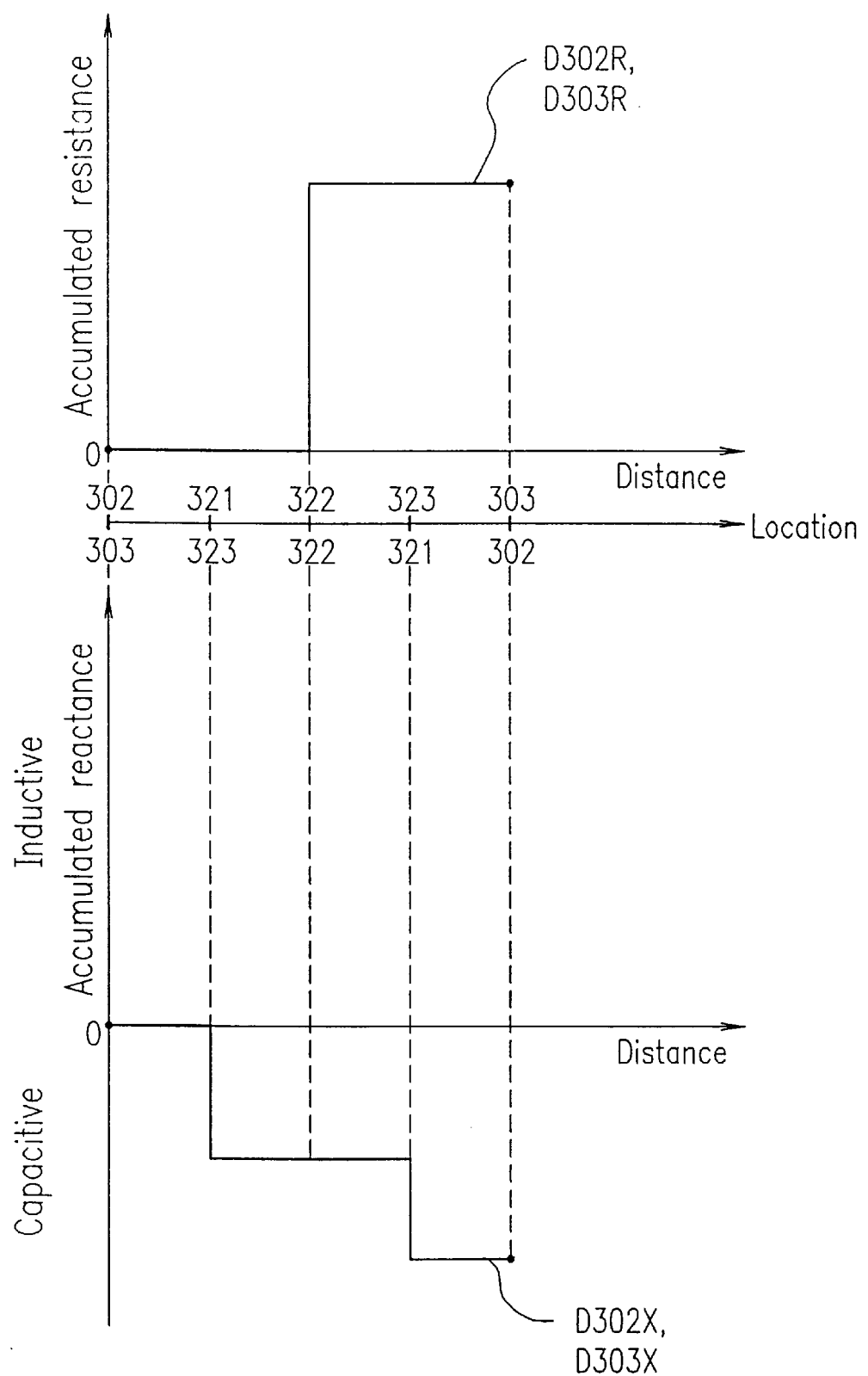
FIG. 5 is a graphic representation illustrating the distributions of the resistance and the reactance viewed from the node 302 of the phase shifter 320 shown in FIG. 4 and the distributions of the resistance and the reactance viewed from the node 303 thereof.

FIG. 5 is a graphic representation illustrating the distributions of the resistance and the reactance viewed from the node 302 of the phase shifter 320 shown in FIG. 4 (these distributions will be denoted by D302R and D302X, respectively) and the distributions of the resistance and the reactance viewed from the node 303 thereof (these distributions will be denoted by D303R and D303X, respectively). In FIG. 5, the axis of the ordinates in the upper graph indicates the distribution of the accumulated resistance components, while the axis of the ordinates in the lower graph indicates the distribution of the accumulated reactance components. The axes of the abscissas in both graphs indicate the distance viewed from the node 302 or 303. The axis of the abscissas interposed between these axes indicates the location of each component in accordance with the distance from the node 302 or 303. The distributions of the resistance and the reactance represent the resistance components and the reactance components which have been accumulated at a point away from a particular node by a certain distance.

As shown in FIG. 5, the distributions D302R and D303R can be represented as the same plot. Similarly, the distributions D302X and D303X can also be represented as the same plot. When the distributions of the resistance and the reactance viewed from the node 302 are substantially equal to the distributions of the resistance and the reactance viewed from the node 303 in such a manner, for example, such distributions will be regarded as satisfying a "resistance/reactance symmetry" between the nodes 302 and 303 for simplicity.

In order to satisfy the resistance/reactance symmetry for a plurality of nodes, the pattern of the circuit boar don which the transmission lines 311 and 312, the capacitors 321 and 323 and the resistor 322 are mounted is typically line symmetric with respect to the line CL connecting the node 301 and the resistor 322. However, not only such a line symmetric pattern is required but also the capacitance values of the capacitors 321 and 323 and the physical parameters (e.g., the lengths, the characteristic impedances and the like of the lines) of the transmission lines 311 and 312 are required to be equal. The circuit pattern for realizing the resistance/reactance symmetry with respect to the nodes 302 and 303 is not limited to a line symmetric pattern, but may be a point symmetric pattern.

The impedance matching at the respective nodes and the isolation between the nodes 302 and 303 are simultaneously realized by using the following exemplary parameters:

Node 301: terminated at about 50Ω;
Nodes 302 and 303: terminated at about (10+j12)Ω;
Reactances of capacitors 321 and 323: about −12Ω;
Resistance of resistor 322: about 20Ω;
Characteristic impedances of transmission lines 311 and 312: about 30Ω; and
Lengths of transmission lines 311 and 312: about 5λ/24 (<λ/4).

Figure 6:
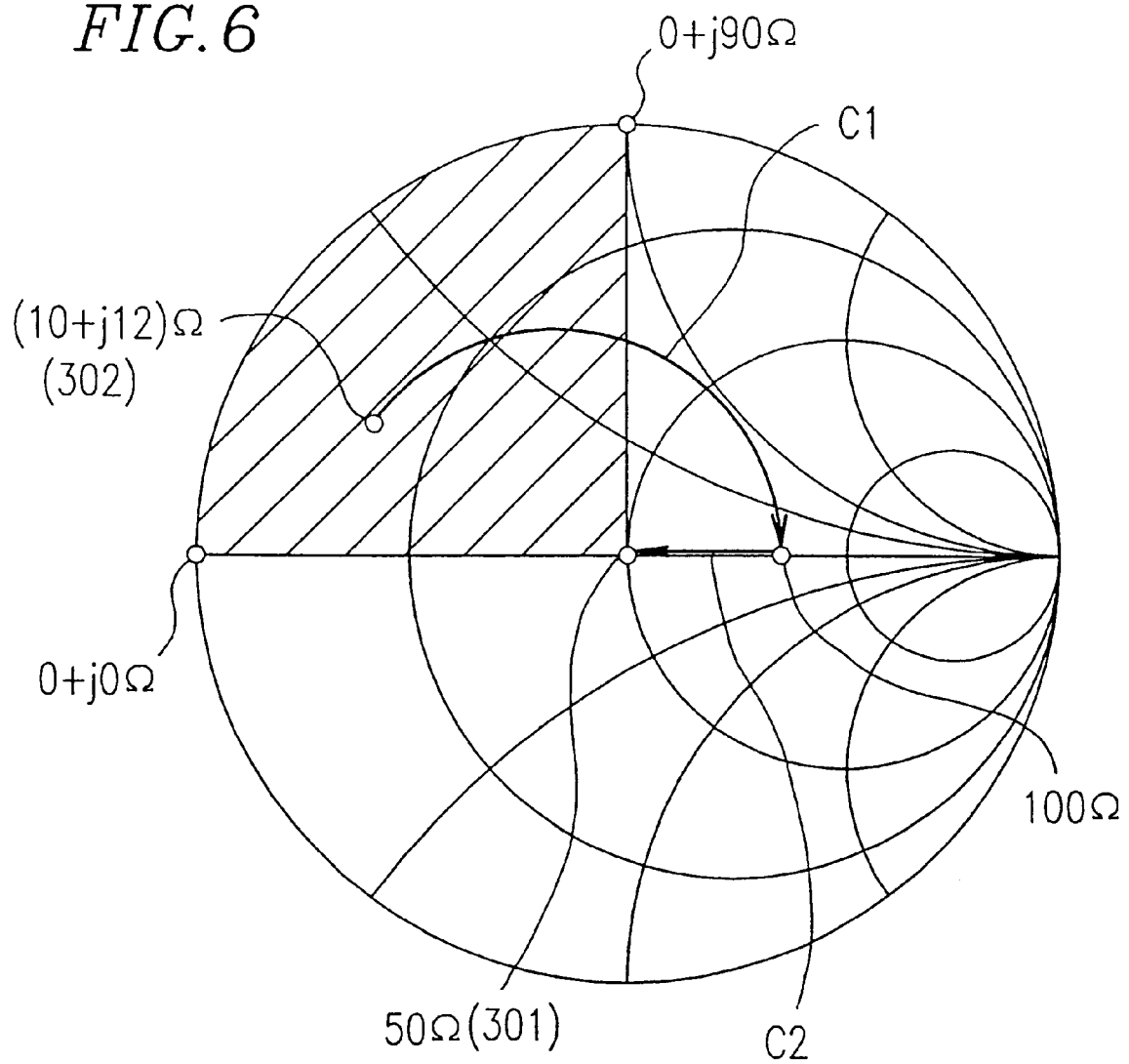
FIG. 6 is a chart for illustrating an impedance matching realized in the first example.

First, the reasons why the impedance matching is realized will be described with reference to FIG. 6. FIg. 6 is a chart for illustrating an impedance matching realized in the first example. The impedance of about (10+j12)Ω at the nodes 302 and 303 is converted into a pure resistance of about 100Ω by the transmission lines 311 and 312, respectively (as indicated by the arrow C1 shown in FIG. 6). In other words, assuming that the transmission line 312 does not exist, the impedance viewed from the node 301 toward the node 302 becomes about 100Ω. The two transmission lines 311 and 312 are connected to the node 301 so that the impedance viewed from the node 301 toward the nodes 302 and 303 becomes about 50Ω (as indicated by the arrow C2 shown in FIG. 6). This means that an impedance matching is realized.

Next, the reasons why an isolation between the nodes 302 and 303 is realized will be described. The "isolation" herein means that when an RF signal is input through one terminal of a circuitry, the signal is not output through the other terminal thereof. In order to realize an isolation, the RF signals passing through a plurality of paths should be cancelled. In this example, the following two paths are used as the plurality of paths:

Path P311–312: path passing through node 302, transmission line 311, transmission line 312 and node 303 in this order and Path P320: path passing through node 302, capacitor 321, resistor 322, capacitor 323 and node 303 in this order In the path P311–312, the signal passes through the transmission lines 311 and 312. Since the lengths of the transmission lines 311 and 312 are about 5λ/24, the transmission lines 311 and 312 gives a phase delay of about 5λ/6 rad to the signal. In the path P320, when the reactances of the capacitors 321 and 323 are about −12Ω, the phase shifter 320 gives a phase lead of about λ/6 rad to the signal. Consequently, a phase difference between the signal passing through the path P311–312 and the signal passing through the path P320 is about λ rad (i.e., these two signals have inverse phases).

Furthermore, the resistance value of the resistor 322 is set to be about 20Ω such that the value of the current flowing through the path P311–312 becomes equal to the value of the current flowing through the path P320. As described above, in this example, a signal input through the node 302 is divided into two signals having inverse phases and an equal magnitude and then output through the node 303. As a result, the signal input through the node 302 is cancelled at the node 303. That is to say, in this example, the isolation between the nodes 302 and 303 is realized.

Figure 7:
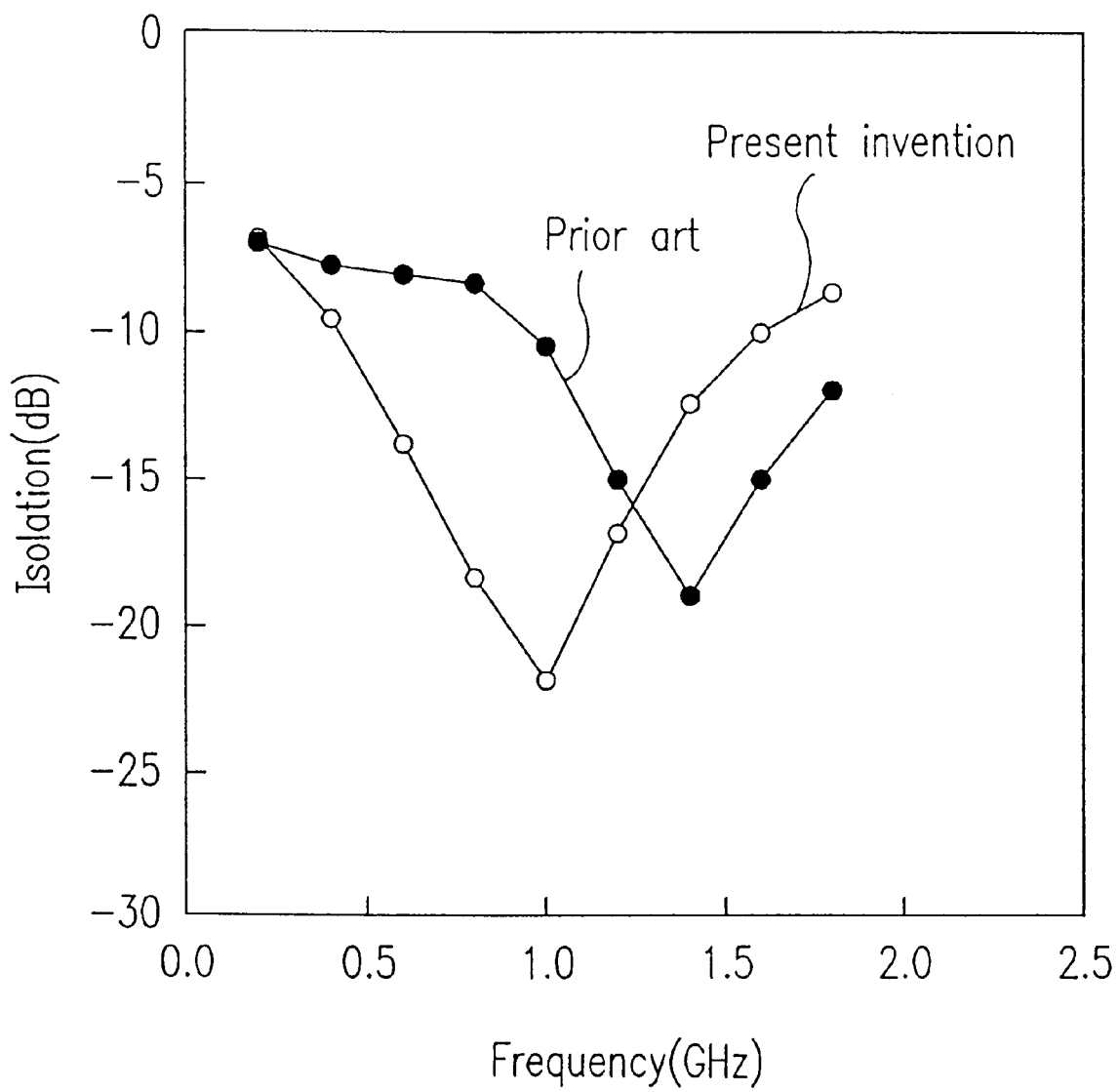
FIG. 7 is a graphic representation for illustrating the improved characteristics of the divider/combiner of the present invention as compared with those of a conventional divider/combiner.

FIG. 7 is a graphic representation for illustrating the improved characteristics of the divider/combiner of the present invention as compared with those of a conventional divider/combiner. The divider/combiner of the present invention includes capacitors 321 and 323 having a capacitance of about 14 pF. On the other hand, the conventional divider/combiner does not include any capacitor as shown in FIG. 1. In FIG. 7, the plot representing the characteristics of the divider/combiner of the present invention is shown by the hollow circles, while the plot representing the characteristics of the conventional divider/combiner is shown by the solid circles.

In the conventional divider/combiner, the frequency at which the impedance matching is realized is about 1.0 GHz (not shown), whereas the isolation characteristics are optimized at about 1.4 GHz. Thus, in the conventional divider/combiner, since these frequencies are different from each other by about 0.4 GHz, it is impossible to simultaneously optimize the impedance matching and the isolation characteristics. Furthermore, in the conventional divider/combiner, the isolation at the frequency of about 1.0 GHz at which the impedance matching is realized is at most about −10 dB.

On the other hand, in the divider/combiner according to the present invention, a satisfactory isolation of about −22 dB or less is realized at the frequency of about 1.0 GHz at which the impedance matching is realized and the impedance matching and such a satisfactory isolation can be simultaneously realized.

Figure 8:
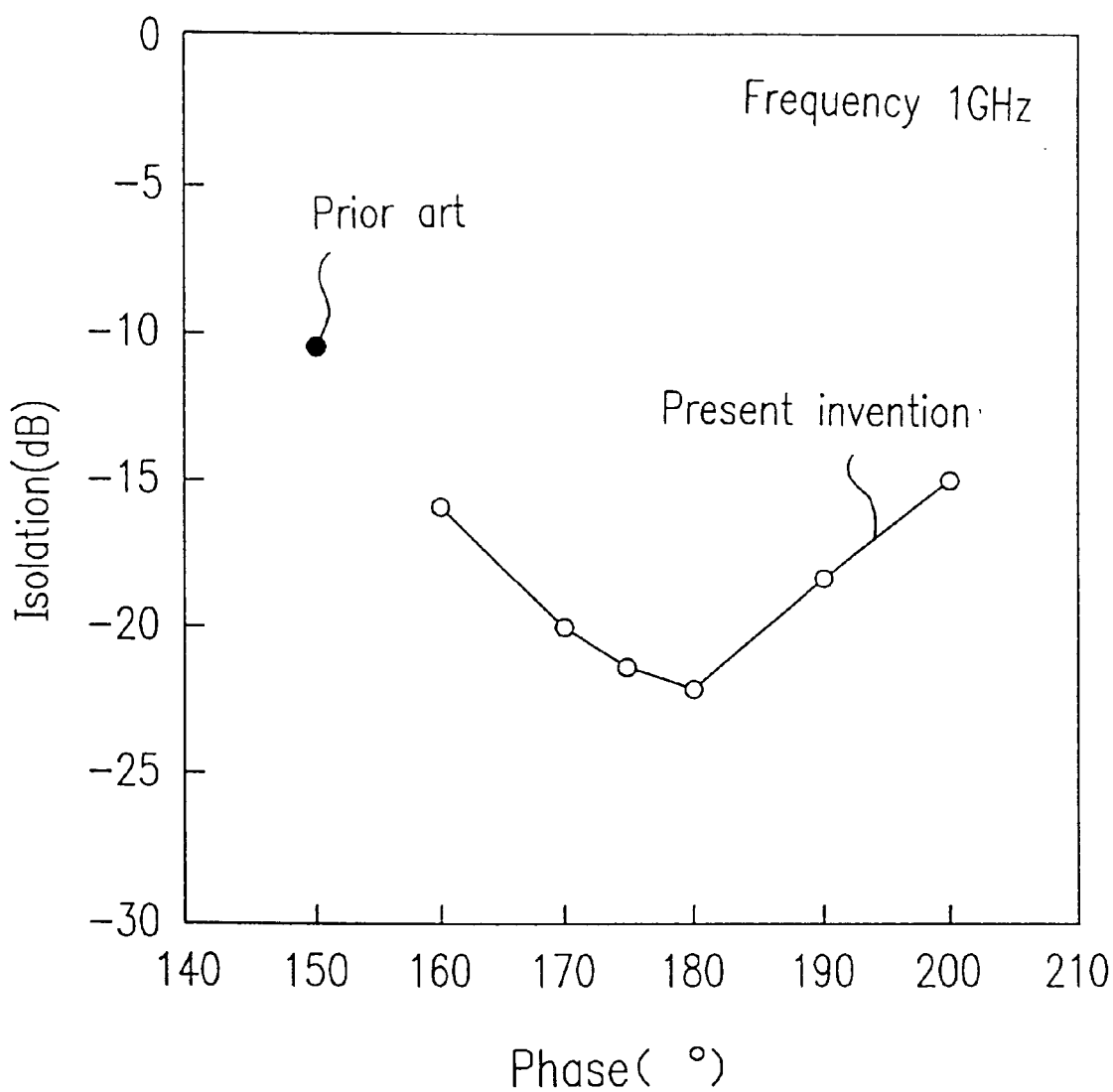
FIG. 8 is a graphic representation illustrating the variation in isolation values between the nodes 302 and 303 in accordance with the phase difference between the signal passing through the path P311–312 and the signal passing through the path P320 at a frequency of about 1.0 GHz.

FIG. 8 is a graphic representation illustrating the variation in isolation values between the nodes 302 and 303 in accordance with the phase difference between the signal passing through the path P311–312 and the signal passing through the path P320 at a frequency of about 1.0 GHz. In FIG. 8, the axis of the abscissas indicates a phase difference between the two signals passing through the two paths and the axis of the ordinates indicates the isolation value between the two nodes. In order to realize a satisfactory isolation (i.e. an isolation value of about −15 dB or less), the phase difference is preferably in a range from about 160° to about 200°. On the other hand, in order to realize a more satisfactory isolation (i.e. an isolation value of about −18 dB or less), the phase difference is preferably in a range from about 170° to about 190°. As indicated by the close circle in FIG. 8, the phase difference of the conventional divider/combiner is about 150° and a realized isolation is at most about −10 dB. Thus, as can be seen from FIg. 8, the divider/combiner of the present invention realizes far more satisfactory isolation characteristics than those attained by the conventional divider/combiner.

In general, a divider/combiner in which an input node is terminated by a pure resistance (e.g., about 50Ω) and two output nodes are terminated by an impedance existing in the second quadrant (i.e., the hatched portion shown in FIg. 6) of a Smith chart except for the real axis thereof is required to have a transmission line shorter than about λ/4 for realizing an impedance matching as is true of the present example. In the conventional configuration, the isolation between output nodes is deteriorated in such a case. However, according to the present invention, a remarkable improvement of the isolation characteristics is realized by controlling the phases by means of the phase shifter 320.

The difference between the divider/combiner of the present invention and the power amplifier described in Japanese Laid-Open Patent Publication No. 7-263981 will be described below. In the power amplifier described in this patent publication, a phase delay element is asymmetrically connected to a resistor existing between the end points of the two transmission lines (i.e., the points corresponding to the nodes 302 and 303 in this example). In such a case, the resistor consumes power and decreases a gain so that the oscillation is prevented. However, in this amplifier, the output power and the efficiency are adversely decreased because of the decrease in gain and the power loss in the resistor. Thus, the conventional amplifier cannot realize an isolation between the output nodes.

On the other hand, according to the present invention, the parameters and the physical arrangement of the circuit are determined so as to satisfy the resistance/reactance symmetry with respect to the nodes 302 and 303 as described above. When the resistance/reactance symmetry is satisfied, the signals applied to the resistor have the same phase so that the power is not consumed by the resistor. In addition, the phase shifter 320 is connected between the nodes 302 and 303 such that a phase difference between the signal passing through the path P311–312 and the signal passing through the path P320 becomes about π rad (i.e., the phases of the two signals become inverse). As a result, an isolation is secured between the nodes 302 and 303.

Hereinafter, for simplicity of description, such a division that an RF signal input through a node is output through a number N (where N is an integer equal to or larger than 2) of nodes will be referred to as a "1-N" division, while such a combination that an RF signal input through a number N (where N is an integer equal to or larger than 2) of nodes is output through a node will be referred to as a "N-1" combination. In this example, a 1-2 division and a 2-1 combination have been described. However, the present invention is not limited thereto. Those skilled in the art would readily understand that the embodiment of the present invention may be modified so as to implement a 1-N division and an N-1 combination (where N is an integer equal to or larger than 3).

Furthermore, the divider/combiner of the present invention may be implemented as a dedicated divider or a dedicated combiner.

EXAMPLE 2

Figure 9:
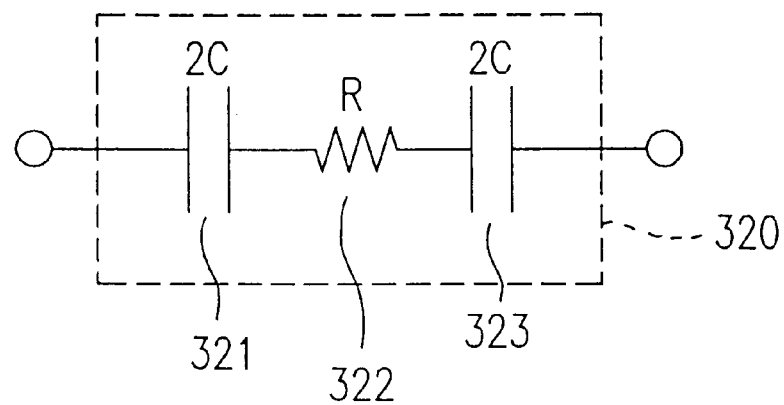
FIG. 9 is a diagram showing the phase shifter 320 used in the first example.

In the first example, a capacitor 321, a resistor 322 and a capacitor 323 which are serially connected to each other are used as a phase shifter 320. FIG. 9 shows again the same phase shifter 320 as that used in the first example for describing this second example. Herein, the capacitors 321 and 323 are assumed to have a capacitance 2C and the resistor 322 is assumed to have a resistance R. In the following description, in order to eliminate redundancy, the points which are different between the first and second examples will be mainly described and common points will be omitted.

Figure 10:
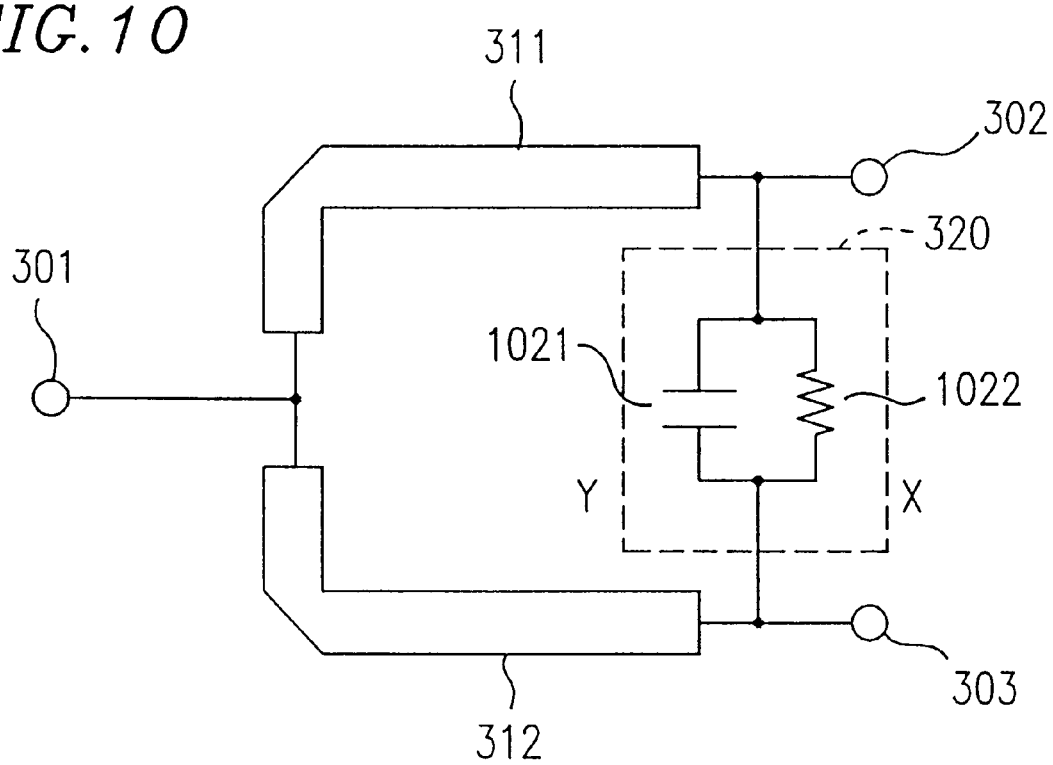
FIG. 10 is a circuit diagram of a divider/combiner in the second example of the present invention.

FIG. 10 is a circuit diagram of a divider/combiner in the second example of the present invention. In this second example, a capacitor 1021 and a resistor 1022 which are connected in parallel to each other are used as a phase shifter 320. The circuit shown in FIG. 10 also satisfies the resistance/reactance symmetry. When the resistance/reactance symmetry is satisfied, the RF signals applied to the resistor 1022 have the same phase. Accordingly, the resistor 1022 does not consume the power of the RF signals. The divider/combiner of the second example can also realize the impedance matching and the isolation in the same way as in the first example.

Suppose the capacitor 1021 has a capacitance Y and the resistor 1022 has a resistance X. Then, the relationship given by the following Equation 1 is satisfied:

$$(R+1/j\omega C)(1/X+j\omega Y)=1 \quad (1)$$

By modifying Equation 1, the following Equations 2 and 3 are obtained:

$$X=1/\omega^2 CRY \quad (2)$$

$$Y/C+R/X=1 \quad (3)$$

By substituting Equation 2 into Equation 3, the following Equation 4 is obtained:

$$Y=C/(1+\omega^2 C^2 R^2) \quad (4)$$

If Equation 4 is solved under the conditions where R≈20Ω, 2C≈14 pF (i.e., C≈7 pF), ω≈2πf and f≈1 GHz, then Y≈4 pF. If this value is substituted into Equation 2, then X≈40Ω. This means that the phase shifter 320 including the capacitor 1021 and the resistor 1022 which are connected in parallel as shown in FIG. 10 can be used instead of the phase shifter 320 of the first example including two capacitors and one resistor which are serially connected to each other.

EXAMPLE 3

Figure 11:
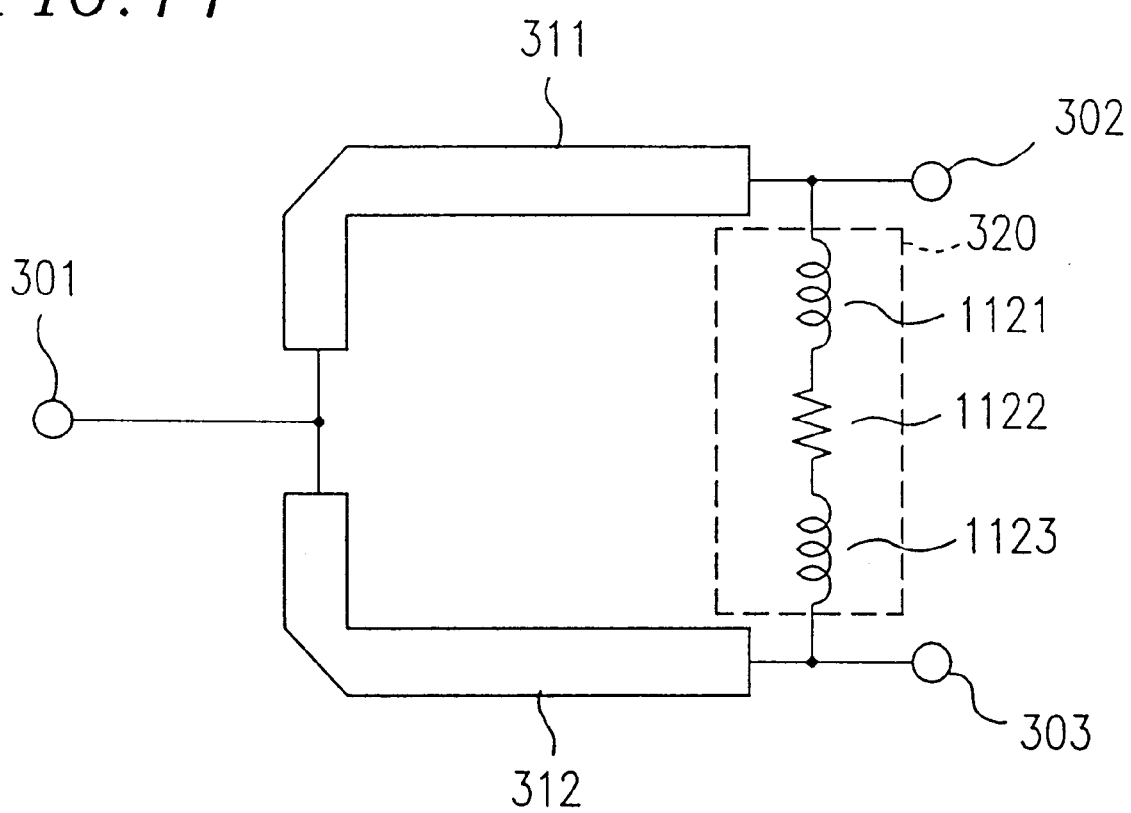
FIG. 11 is a circuit diagram of a divider/combiner in the third example of the present invention.

FIG. 11 is a circuit diagram of a divider/combiner in the third example of the present invention. Though the phase shifter 320 of the first example includes two capacitors, the phase shifter 320 of the third example includes an inductor 1121, a resistor 1122 and an inductor 1123 which are serially connected to each other. The resistor 1122 is assumed to have a resistance R. In the following description, in order to eliminate redundancy, the points which are different between the first and third examples will be mainly described and common points will be omitted. The circuit shown in FIG. 11 also satisfies the resistance/reactance symmetry. When the resistance/reactance symmetry is satisfied, the RF signals applied to the resistor 1122 have the same phase. Accordingly, the resistor 1122 does not consume power of the RF signals. The divider/combiner of the third example can also realize the impedance matching and the isolation in the same way as in the first example.

The impedance matching at the respective nodes and the isolation between the nodes 302 and 303 are simultaneously realized by using the following exemplary parameters:

Node 301: terminated at about 50Ω;
Nodes 302 and 303: terminated at about (10-j12)Ω;
Reactance of inductors 1121 and 1123: about 12Ω;
Resistance of resistor 1122: about 20Ω;
Characteristic impedances of transmission lines 311 and 312: about 30Ω; and
Lengths of transmission lines 311 and 312: about 7λ/24 (>λ/4).

Figure 12:
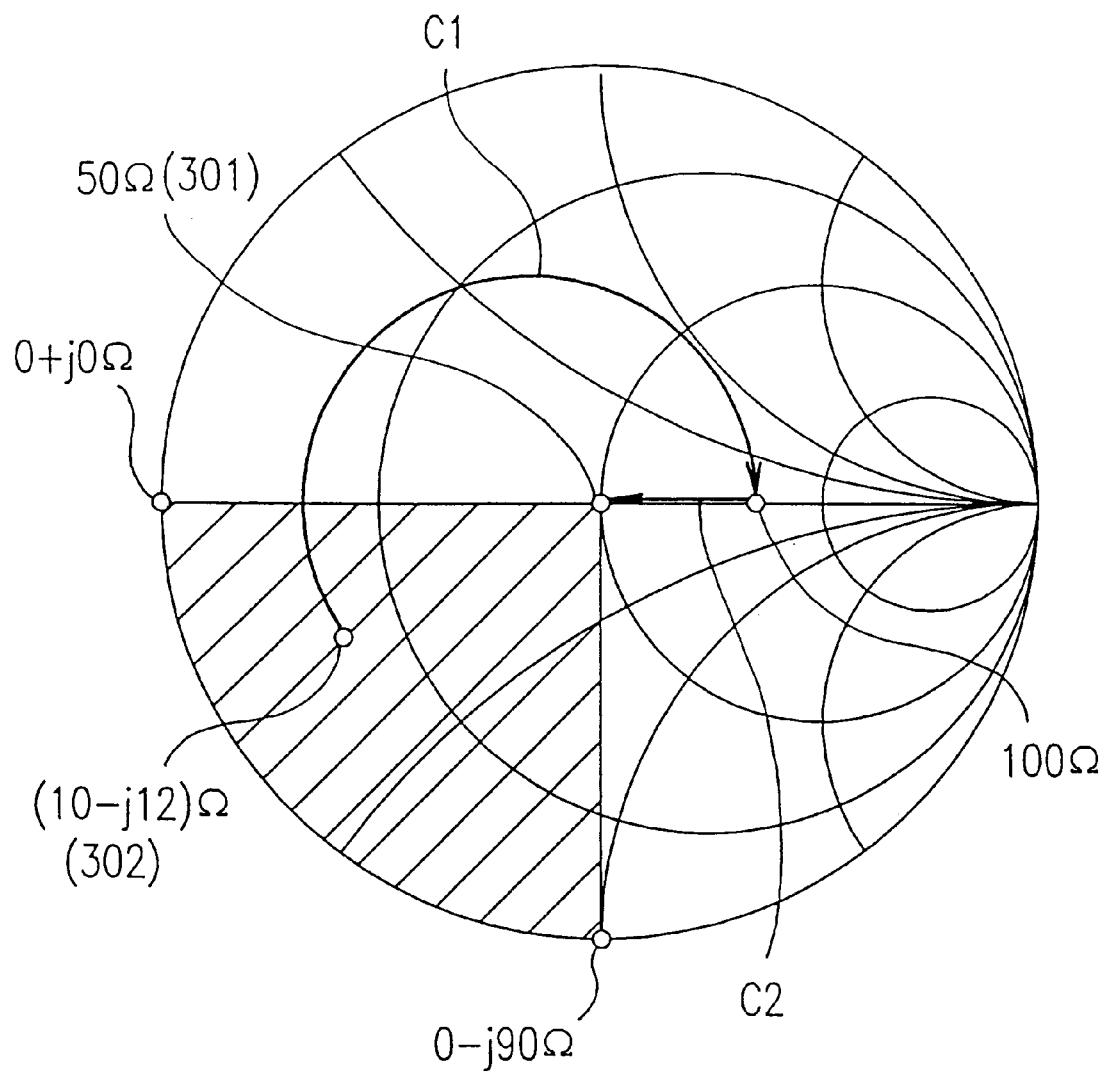
FIG. 12 is a chart for illustrating an impedance matching realized in the third example.

FIG. 12 is a chart for illustrating an impedance matching realized in the third example. The impedance of about (10-j12)Ω at the nodes 302 and 303 is converted into a pure resistance of about 100Ω by the transmission lines 311 and 312, respectively (as indicated by the arrow C1 shown in FIG. 12). In other words, assuming that the transmission line 312 does not exist, the impedance viewed from the node 301 toward the node 302 becomes about 100Ω. The two transmission lines 311 and 312 are connected to the node 301 so that the impedance viewed from the node 301 toward the nodes 302 and 303 becomes about 50Ω (as indicated by the arrow C2 shown in FIG. 12). This means that an impedance matching is realized.

The present example is applicable particularly effectively to a case where the node 301 is terminated by a pure resistance (e.g., about 50Ω) and the output nodes 302 and 303 are terminated by an impedance existing within a third quadrant (hatched portion shown in FIG. 12) of the Smith chart.

Next, the reasons why an isolation is realized between the nodes 302 and 303 will be described. When an RF signal is applied to the node 302, the RF signal passes through the paths P311–312 and P320 to reach the node 303 as described in the first example. In the path P311–312, the signal passes through the transmission lines 311 and 312. Since the lengths of the transmission lines 311 and 312 are about 7λ/24, the transmission lines 311 and 312 give a phase delay of about 7λ/6 rad to the signal. In the path P320, when the reactances of the inductors 1121 and 1123 are about 12Ω, the phase shifter 320 gives a phase delay of about λ/6 rad to the signal. Consequently, a phase difference between the signal passing through the path P311–312 and the signal passing through the path P320 is about π rad (i.e., these two signals have inverse phases).

Furthermore, the resistance value of the resistor 1122 is set such that the value of the current flowing through the path P311–312 becomes equal to the value of the current flowing through the path P320. As described above, in this example, a signal input through the node 302 is divided into two signals having inverse phases and an equal magnitude and then output through the node 303. As a result, the signal input through the node 302 is cancelled at the node 303. That is to say, in this example, the isolation between the nodes 302 and 303 is realized in the same way as in the first example.

EXAMPLE 4

Figure 13:
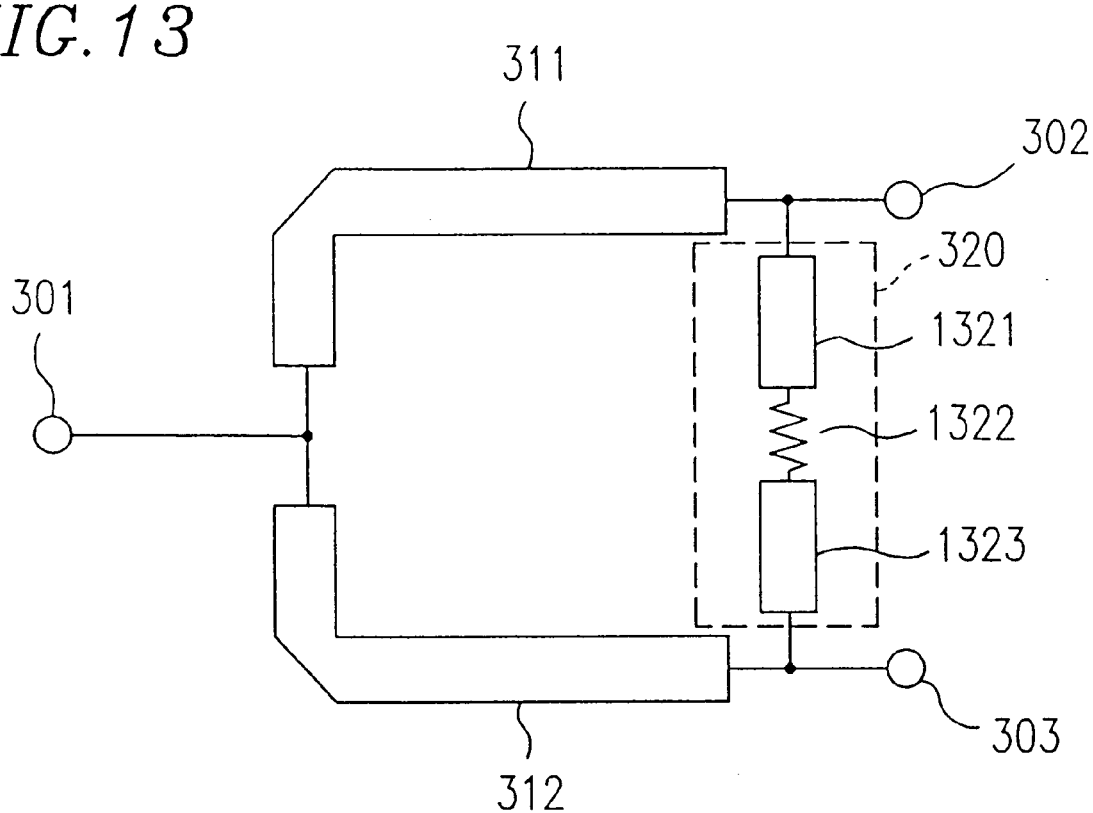
FIG. 13 is a circuit diagram of a divider/combiner in the fourth example of the present invention.

FIG. 13 is a circuit diagram of a divider/combiner in the fourth example of the present invention. Though the phase shifter 320 of the third example includes two inductors, the phase shifter 320 of the fourth example includes a transmission line 1321, a resistor 1322 and a transmission line 1323 which are serially connected to each other. In the following description, in order to eliminate redundancy, the points which are different between the third and fourth examples will be mainly described and common points will be omitted. The circuit shown in FIG. 13 also satisfies the resistance/reactance symmetry. When the resistance/reactance symmetry is satisfied, the RF signals applied to the resistor 1322 have the same phase. Accordingly, the resistor 1322 does not consume power of the RF signals. The divider/combiner of the fourth example can also realize the impedance matching and the isolation in the same way as in the first example.

The impedance matching at the respective nodes and the isolation between the nodes 302 and 303 are simultaneously realized by using the following exemplary parameters:
Node 301: terminated at about 50Ω;
Nodes 302 and 303: terminated at about (10-j12)Ω;
Characteristic impedances of transmission lines 1321 and 1323: about 30Ω;
Lengths of transmission lines 1321 and 1323: about λ/24;
Resistance of resistor 1322: about 20Ω;
Characteristic impedances of transmission lines 311 and 312: about 30Ω; and
Lengths of transmission lines 311 and 312: about 7λ/24 (>λ/4).

EXAMPLE 5

In the conventional power divider/combiner shown in FIG. 1, as the operating frequency becomes higher, the distance between the nodes 102 and 103 becomes more and more critical. In such a case, the characteristics of the isolation between the nodes 102 and 103 are adversely deteriorated.

In the following description, in order to eliminate redundancy, the points which are different between the first and fifth examples will be mainly described and common points will be omitted.

Figure 14A:
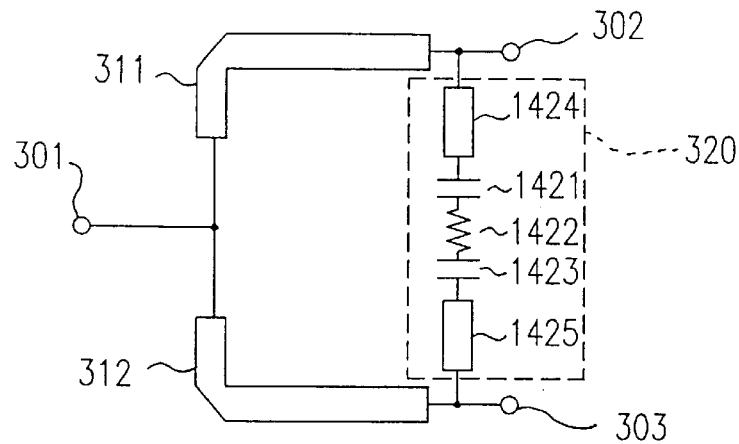
FIG. 14A to 14C are circuit diagrams of a divider/combiner in the fifth example of the present invention.
Figure 14B:
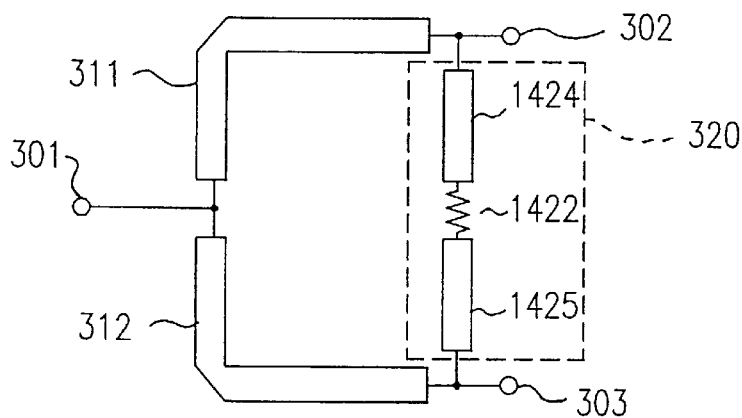
Figure 14C:
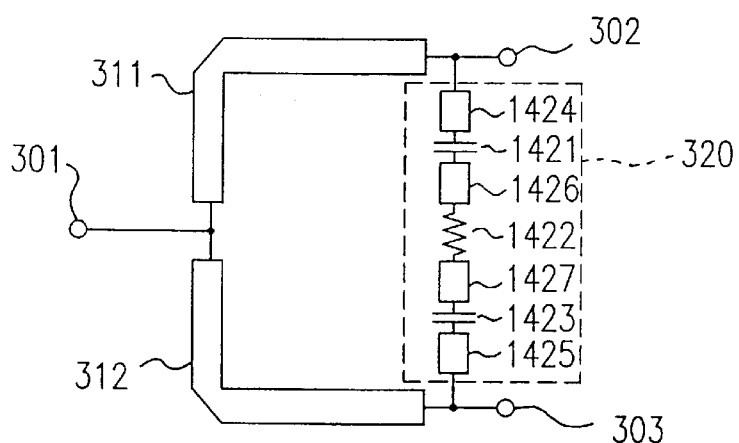

FIGS. 14A, 14B and 14C are circuit diagrams of a divider/combiner in the fifth example of the present invention.

Though the phase shifter 320 in the first example includes two capacitors and one resistor, the phase shifter 320 in the fifth example shown in FIG. 14A includes a transmission line 1424, a capacitor 1421, a resistor 1422, a capacitor 1423 and a transmission line 1425 which are serially connected to each other in this order.

The circuit shown in FIG. 14A also satisfies the resistance/reactance symmetry. In addition, the divider/combiner of the fifth example can also realize the impedance matching and the isolation in the same way as in the first example. The RF signals applied to the resistor 1422 have the same phase. Accordingly, the resistor 1422 does not consume power of the RF signals.

In the circuit shown in FIG. 14A, the impedance matching at the respective nodes and the isolation between the nodes 302 and 303 are simultaneously realized by using the following exemplary parameters:
Frequency used: about 1 GHz;
Dielectric constant of circuit board: about 10.5;
Nodes 301, 302 and 303: terminated at about 50Ω;
Lengths of transmission lines 1424 and 1425: about 5 mm;
Resistance of resistor 1422: about 100Ω;
Characteristic impedances of transmission lines 311 and 312: about 70Ω; and
Lengths of transmission lines 311 and 312: about 30 mm (=λ/4).

Hereinafter, the importance of the capacitors 1421 and 1423 will be described. As an exemplary case where the distance between the nodes 302 and 303 is non-negligible with respect to the wavelength, the distance between the nodes 302 and 303 is assumed to be about 10 mm (=λ/12).

First, assume that the capacitor 1421 sandwiched between the transmission line 1424 and the resistor 1422 and the capacitor 1423 sandwiched between the transmission line 1425 and the resistor 1422 are not provided. Then, the difference between the phase shift caused in the path passing from the node 302 through the two transmission lines 311 and 312 to the node 303 (path P311–312) and that caused in the path passing from the node 302 through the phase shifter 320 to the node 303 (i.e., the path P320) do not become about π rad (i.e., the phases are not inversed to each other). Consequently, the isolation characteristics cannot be realized between the nodes 302 and 303.

Next, the divider/combiner of the fifth example shown in FIG. 14A will be considered. In this example, not only the transmission lines 1424 and 1425 but also the capacitors 1421 and 1423 are serially connected. In this case, the capacitance values of the capacitors 1421 and 1423 are set such that the shifts in phases resulting from the transmission lines 1424 and 1425 are cancelled. That is to say, the capacitance values are set such that the transmission line 1424 and capacitor 1421 pair and the transmission line 1425 and capacitor 1423 pair are serially oscillated at a frequency of about 1 GHz.

For example, on a circuit board having a frequency of about 1 GHz and a dielectric constant of about 10.5, the transmission line 1424 having a length of about 5 mm gives a phase delay of about π/12 rad. On the other hand, when the capacitance of the capacitor 1421 is about 14 pF, the capacitor 1421 gives a phase lead of about π/12 rad. Consequently, in this case, the capacitor 1421 cancels the phase shift caused by the transmission line 1424. Under the similar conditions, the capacitor 1423 cancels the phase shift caused by the transmission line 1425. As a result, the difference between the phase shift caused in the path P311–312 and that caused in the path P320 becomes about π rad (i.e., the phases are inversed to each other). In this case, when the lengths of the transmission lines 1424 and 1425 are different, the capacitances of the capacitors 1421 and 1423 are required to be optimized correspondingly.

As described above, in this example, even when the distance between the nodes 302 and 303 is non-negligible with respect to the wavelength, the transmission line 1424 and capacitor 1421 pair and the transmission line 1425 and capacitor 1423 pair are serially oscillated at the frequency used. As a result, the isolation is realized between the nodes 302 and 303.

The phase shifter 320 in the fifth example shown in FIG. 14B includes a transmission line 1424, a resistor 1422, and a transmission line 1425 which are serially connected to each other in this order. When the distance between the nodes 302 and 303 with respect to the wavelength used becomes further longer (e.g., when the distance is about λ), the circuit shown in FIG. 14B can simultaneously realize the impedance matching at the respective nodes and the isolation between the nodes 302 and 303 by using the following exemplary parameters:

Frequency used: about 1 GHz;
Dielectric constant of circuit board: about 10.5;
Nodes 301, 302 and 303: terminated at about 50Ω;
Lengths of transmission lines 1424 and 1425: about 60 mm (=λ/2);
Resistance of resistor 1422: about 100Ω;
Characteristic impedances of transmission lines 311 and 312: about 70Ω; and
Lengths of transmission lines 311 and 312: about 90 mm (=3λ/4).

When the difference between the phase shift caused in the path P311–312 and that caused in the path P320 become about π rad (i.e., the phases are inversed to each other), the isolation can be realized. Thus, not only in the above-described specific example, but in general, it is preferable to set the lengths of the transmission lines 1424 and 1425 to be nλ/2 (where n is a natural number) and to set the lengths of the transmission lines 311 and 312 to be (2n+1)λ/4 (where n is a natural number) in order to realize the isolation.

Herein, the transmission lines 311 and 312 may have respectively different characteristic impedences. For example, one of the transmission lines 311 and 312 may be a transmission line having a characteristic impendance of about 50 Ω and a length of about 60 mm (=λ/2) and the other of the transmission lines 311 and 312 may be a transmission line having a characteristic impedance of about 70 Ω and a length of about 30 mm (−λ/4). For example, a transmission line having a characteristic impedance of about 70 Ω is preferably used as a transmission line in the vicinity of the single input terminal of a 1–2 division/combiner and a transmission line having a characteristic impedance of about 50 Ω is preferably used as a transmission line in the vicinity of the two output terminals thereof. This is because, when the transmission lines 311 and 312 are formed as microstrip lines, the above-exemplified connection can reduce the transmission loss.

Furthermore, when the distance between the nodes 302 and 303 with respect to the wavelength used becomes longer than λ (e.g., 13λ/2), the impedance matching at the respective nodes and the isolation between the nodes 302 and 303 can be simultaneously realized by inserting a capacitor 1421 (14 pF) between transmission lines 1424 and 1426 and a capacitor 1423 (14 pF) between transmission lines 1425 and 1427 as shown in FIG. 14C and using the following exemplary parameters:

Frequency used: about 1 GHz;
Dielectric constant of circuit board: about 10.5;
Nodes 301, 302 and 303: terminated at about 50 Ω;
Lengths of transmission lines 1424, 1425, 1426 and 1427: about 32.5 mm (=13λ/48);
Resistance of resistor 1422: about 100 Ω;
Characteristic impedances of transmission lines 311 and 312: about 70 Ω; and
Lengths of transmission lines 311 and 312: about 90 mm (=3λ/4).

In this example, the capacitor 1421 cancels the phase shift corresponding to a part of transmission line of 5 mm which is a difference between the sum length (about 65 mm) of the transmission lines 1424 and 1426 and about 60 mm (=λ/2) and the capacitor 1423 cancels the phase shift corresponding to a part of transmission line of 5 mm which is a difference between the sum length (about 65 mm) of the transmission lines 1425 and 1427 and about 60 mm (=λ/2). As described above, by setting the lengths of the transmission lines 311 and 312 to be about (2n+1)λ/4 and setting the phase difference between the nodes 302 and 303 in the phase shifter to be about nπ, the isolation can be realized. Thus, it is preferable to get the lengths of the transmission lines 311 and 312 to be about (2n+1)λ/4 (where n is a natural number).

EXAMPLE 6

Figure 15:
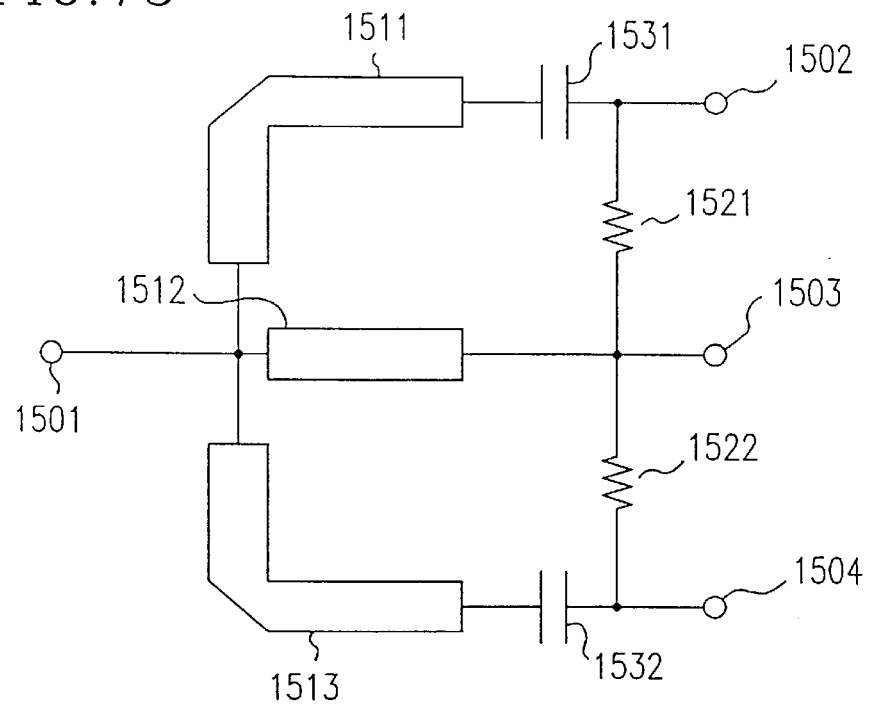
FIG. 15 is a circuit diagram of a divider/combiner in the sixth example of the present invention.

FIG. 15 is a circuit diagram of a divider/combiner in the sixth example of the present invention. In conventional Wilkinson type power dividers using transmission lines, the length of each transmission line must be set to be about λ/4 in order to realize the impendance matching and the isolation. However, it is difficult to lay out a 1-N division/N-1 combination divider/combiner (where N is an integer equal to or larger than 3) so as to equalize the lengths of the respective transmission lines. When the lengths of the transmission lines are different, the performance of the circuit are disadvantageously deteriorated. Specifically, in the case of mounting the circuit shown in FIG. 15 on a circuit board, the transmission lines 1511 and 1513 become longer than the transmission line 1512 as schematically illustrated in FIG. 15. The divider/combiner of the sixth example can overcome such disadvantages resulting from the non-uniform lengths of the transmission line.

The divider/combiner of the sixth example is different from a conventional 1–3 division divider using transmission lines in that capacitors 1531 and 1532 are serially inserted between the node 1502 and an outer transmission line 1511 and the node 1503 and the other outer transmission line 1513. Herein, the lengths of the outer transmission lines 1511 and 1513 are longer than that of the central transmission line 1512. In this example, the length of the central transmission line 1512 is about λ/4 and the phase of the node 1503 is delayed from the phase of the node 1501 by about π/2rad. On the other hand, the lengths of the two outer transmission lines 1511 and 1513 are about 0.285 (>λ/4), which are longer than that of the central transmission line 1512. A phase delay resulting from this transmission line is about 0.57πrad. If a phase lead of about 0.07πrad is caused by the capacitor 1531 serially inserted adjacent to the outer transmission line 1511, then the phase delays at the nodes 1502 and 1504 as viewed from the node 1501 become equal to π/2 rad. That is to say, the capacitors 1531 and 1532 cancel the phase difference resulting from the length difference among the transmission lines so that all the phases of the signals are the same at the nodes 1502, 1503 and 1504.

Specifically, in the case where all the nodes 1501, 1502, 1503 and 1504 are terminated at about 50 Ω and the dielectric constant of the circuit board is about 10.5, if the characteristic impedances of the transmission lines 1511, 1512 and 1513 are set to be about 86.6 Ω, the resistances of the resistors 1521 and 1522 are set to be about 150 Ω, the length of the central transmission line 1512 is set to be about 31 mm, the lengths of the other transmission lines 1511 and 1513 are set to be about 35 mm and the capacitances of the capacitors 1531 and 1532 are set to be about 13 pF, then the impedance matching and the isolation are realized at a frequency of about 1 GHz.

EXAMPLE 7

Figure 16:
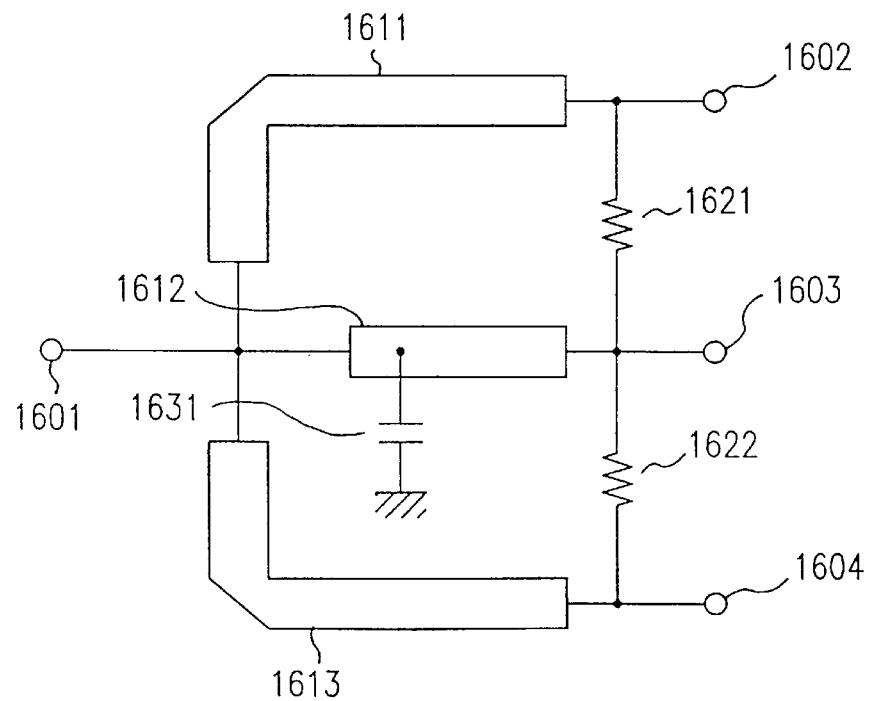
FIG. 16 is a circuit diagram of a divider/combiner in the seventh example of the present invention.

FIG. 16 is a circuit diagram of a divider/combiner in the seventh example of the present invention. The divider/combiner of the seventh example is different from a conventional divider/combiner in that a capacitor 1631 is connected between a point in a central transmission line 1612 (the electrical length of which is shorter than those of the outer transmission lines 1611 and 1613) and a ground.

In this example, the electrical lengths of the two outer transmission lines 1611 and 1613 are about λ/Δ and the phases at the nodes 1602 and 1604 are delayed from the phase at the node 1601 by about π/2 rad. On the other hand, the electrical length of the central transmission line 1612 is about 0.205 λ (<λ/Δ), which is shorter than those of the outer transmission lines 1611 and 1613. The phase delay caused by the transmission line 1612 is about 0.41π rad. If a phase delay of about 0.09π rad is caused by the capacitor 1631 connected between the central transmission line 1612 and a ground, then the phase delay at the node 1603 as viewed from the node 1601 becomes equal to about π/2 rad. That is to say, the capacitor 1631 cancels the phase difference resulting from the length difference among the transmission lines so that all the phases are the same at the nodes 1602, 1603 and 1604.

Specifically, the impedance matching and the isolation are realized under the following exemplary conditions:
Frequency used: about 1 GHz;
Dielectric constant of circuit board: about 10.5;
Nodes 1601, 1602, 1603 and 1604: terminated at about 50 Ω;
Characteristic impedances of transmission lines 1611, 1612 and 1613: about 86.6 Ω;
Resistances of resistors 1621 and 1622: about 150 Ω;
Lengths of transmission lines 1611 and 1613: about 30.0 mm;
Length of transmission line 1612: about 25 mm; and
Capacitance of capacitor 1631: about 0.4 pF.

EXAMPLE 8

Figure 17:
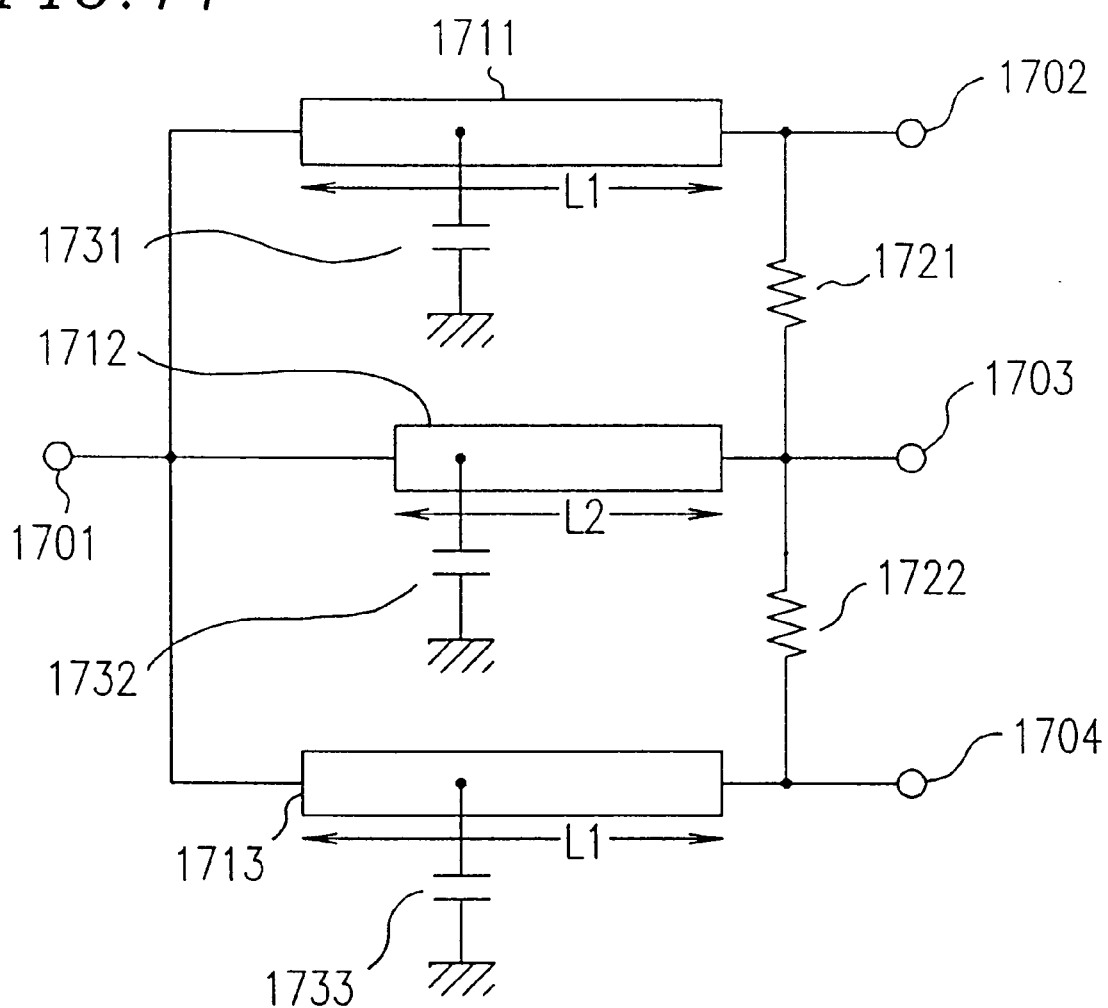
FIG. 17 is a circuit diagram of a divider/combiner in the eighth example of the present invention.

FIG. 17 is a circuit diagram of a divider/combiner in the eighth example of the present invention. The divider/combiner of the eighth example is different from a conventional divider/combiner in that capacitors 1731, 1732 and 1733 are connected between a point in a transmission line 1711 and a ground, between a point in a transmission line 1712 and a ground and between a point in a transmission line 1713 and a ground, respectively, and that the capacitance values of the capacitors 1731, 1732 and 1733 are set so as to equalize the phases at the nodes 1702, 1703 and 1704 in accordance with the lengths of the transmission lines 1711, 1712 and 1713. Thus, at least two of the capacitors 1731, 1732 and 1733 have different capacitance values.

In this example, the lengths of the two outer transmission lines 1711 and 1713 are about 0.205λ, thereby causing a phase delay of about 0.41πrad. In addition, the capacitors 1731 and 1733, the other terminals of which are grounded, also cause a phase delay of about 0.09πrad. Thus, the phases at the nodes 1702 and 1704 are delayed by about π/2 rad.

On the other hand, the length of the central transmission line 1712 is about 0.165 λ. The phase delay caused by the transmission line 1712 s about 0.33π rad. In addition, the capacitor 1732, the other terminal of which is grounded, also causes a phase delay of about 0.1'/πrad. Thus, the phase at the node 1703 is also delayed by about π/2 rad. That is to say, the capacitors 1731, 1732 and 1733 cancel the phase difference resulting from the length difference among the transmission lines, 1711, 1712 and 1713 so that all the phases are the same at the nodes 1702 1703 and 1704.

Specifically, the impedance matching and the isolation are realized under the following exemplary conditions:
Frequency used: about 1 CHz;
Dielectric constant of circuit board: about 10.5;
Nodes 1701, 1702, 1703 and 1704: terminated at about 50 Ω;
Characteristic impedances of transmission lines 1711, 1712 and 1713: about 86.6 Ω;
Resistances of resistors 1721 and 1722; about 150 Ω;
Lengths L2 of transmission lines 1711 and 1713: about 25 mm;
Length L2 of transmission line 1712: about 20 mm;
Capacitances of capacitors 1731 and 1733: about 0.4 pF; and
Capacitance of capacitor 1732: about 0.8 pF.

In the foregoing sixth to eighth examples, 1–3 division/ 3-1 combination dividers/combiners have been described. However, the divider/combiner of the present invention is not limited thereto, but may be modified so as to perform a 1-N division and an N-1 combination (where N is an integer equal to or larger than 4). More remarkable effects can be attained by such a 1-N division/N-1 combination (where N is an integer equal to or larger than 4) divider/combiner. On the other hand, even a 1–2 division/2-1 combination divider/ combiner can attain the same effects as those described above when the lengths of the two transmission lines cannot be equalized. It is noted that a coaxial line or a microstrip line may also be used as the transmission line.

EXAMPLE 9

Figure 18:
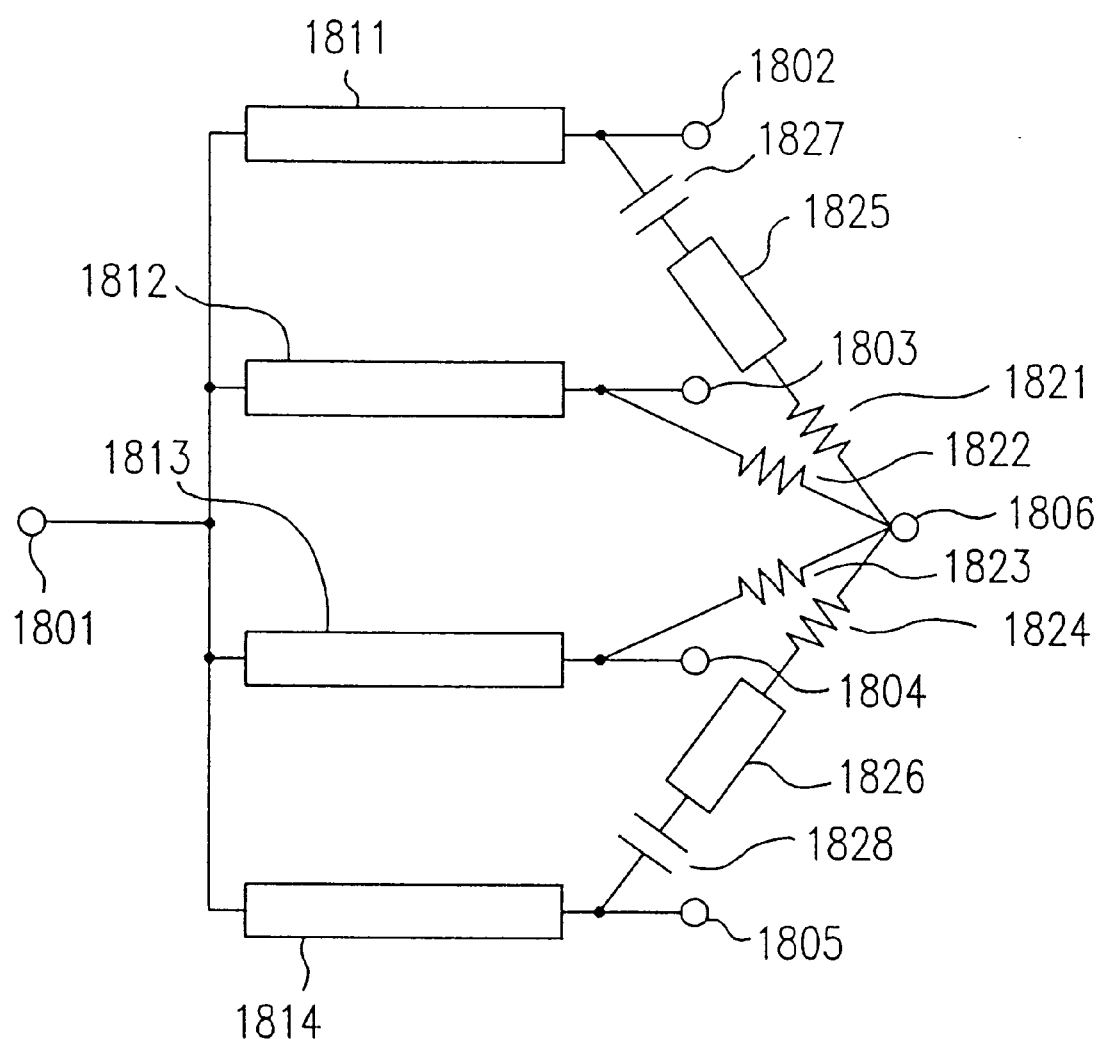
FIG. 18 is a circuit diagram of a divider/combiner in the ninth example of the present invention.

FIG. 18 is a circuit diagram of a divider/combiner in the ninth example of the present invention. As shown in FIG. 18, one terminal of each of the transmission lines 1811, 1812, 1813 and 1814 is commonly connected to a node 1801 and the other terminals of the transmission lines 1811, 1812, 1813 and 1814 are connected to nodes 1802, 1803, 1804 and 1805, respectively. In the case where the circuit shown in FIG. 18 is mounted on a flat circuit board, distances between a node 1806 or an electrical neutral point and the nodes 1802, 1803, 1804 and 1805 become different from each other. In a conventional divider/combiner for which capacitors 1827 and 1828 are not provided, when the length difference becomes non-negligible with respect to the wavelength, the isolation characteristics among the nodes 1802, 1803, 1804 and 1805 have been deteriorated.

In this example, a resistor 1821, a transmission line 1825 and a capacitor 1827 which are serially connected to each other in this order are inserted between the outer node 1802 and the node 1806, while a resistor 1824, a transmission line 1825 and a capacitor 1828 which are serially connected to each other in this order are inserted between the outer node 1805 and the node 1806. In addition, resistors 1822 and 1823 are inserted between the two inner nodes 1803 and 1804 and the node 1806, respectively. It is noted that the circuit shown in FIG. 18 also satisfies the resistance/reactance symmetry. Moreover, the divider/combiner of the ninth example can also realize the impedance matching and the isolation in the same way as in the first example.

Specifically, the impedance matching and the isolation are realized under the following exemplary conditions:
Frequency used: about 1 GHz;
Dielectric constant of circuit board: about 10:5;
Nodes 1801, 1802, 1803, 1804 and 1805; terminated at about 50 Ω;
Characteristic impedances of transmission lines 1811, 1812, 1813 and 1814: about 100 Ω;
Resistances of resistors 1821, 1822, 1823 and 1824: about 100 Ω;
Lengths of transmission lines 1811, 1812, 1813 and 1814: about 30 mm (=λ/4);
Lengths of transmission lines 1825 and 1826: about 5 mm; and Capacitances of capacitors 1827 and 1827: about 14 pF.

Hereinafter, a phase delay caused between two nodes (e.g., the nodes 1806 and 1802) will be denoted by "L1806-1802" or the like, for simplicity of description.

In this example, the distance between the node 1806 and the node 1802 and the distance between the node 1806 and the node 1805 are assumed to be about 10 mm (=λ/12) as a distance non-negligible with respect to the wavelength λ. On the other hand, the distances between the node 1806 and the two inner nodes 1803 and 1804 are assumed to be sufficiently shorter than the wavelength λ. If the circuit shown in FIG. 18 is configured line symmetrically with respect to the line connecting the nodes 1801 and 1806, then the phase delay L1806-1802 becomes equal to the phase delay L1806-1805 and the phase delay L1806-1803 becomes equal to the phase delay L1806-1804. Furthermore, if the capacitance values of the capacitors 1827 and 1828 are set such that the phase delay L1806-1802 becomes equal to the phase delay L1806-1803 and that the phase delay L1806-1805 becomes equal to the phase delay L1806-1804, then the isolation characteristics at the nodes 1802, 1803, 1804 and 1805 are improved.

As described above, in the case where a 1–4 division/4-1 combination divider/combiner is formed on a flat circuit board, even when the distances between the electrical neutral point and the respective nodes are different, the isolation characteristics among the nodes can be improved. This example is generally applicable to a 1N division/N-1 combination (where N-3, 5, 6, 7, . . . ) divider/combiner, too.

Figure 19:
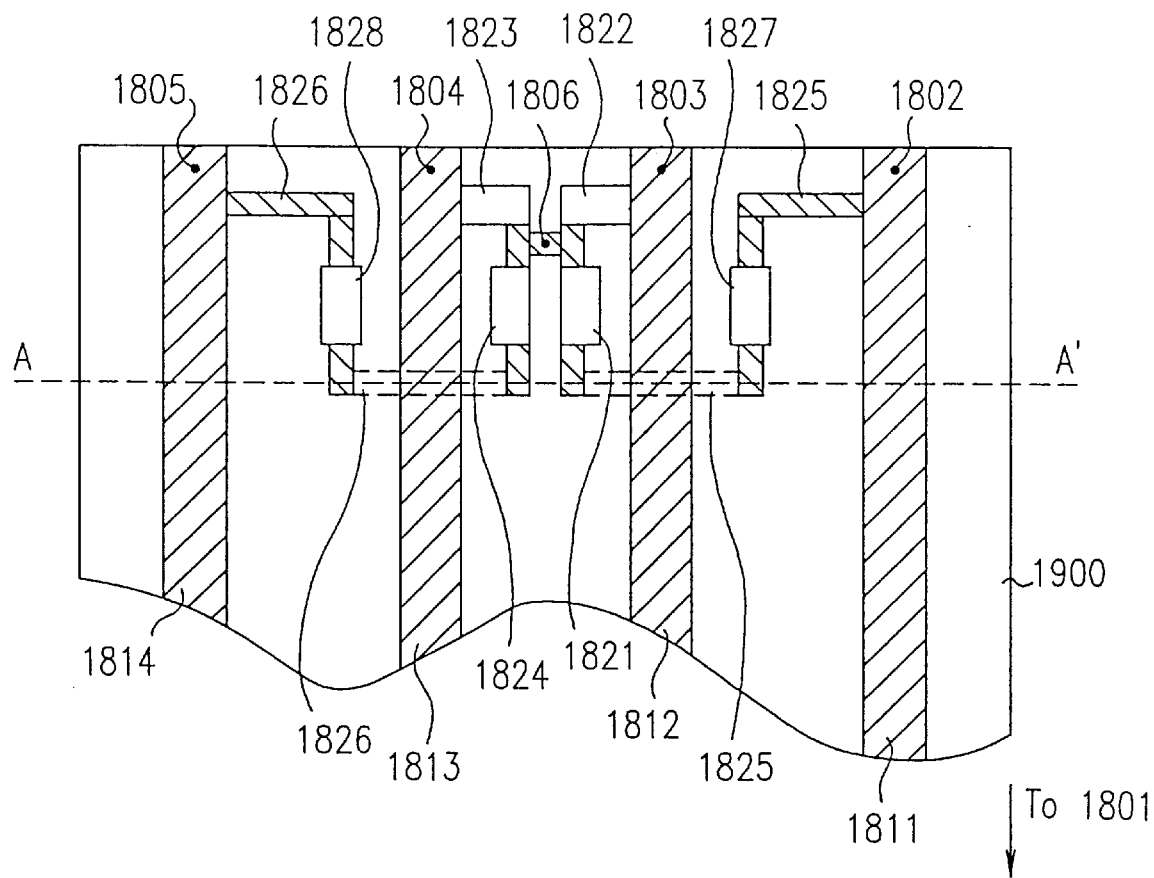
FIG. 19 is a diagram showing a circuit board configuration of the divider/combiner of the ninth example shown in FIG. 18.
Figure 20:
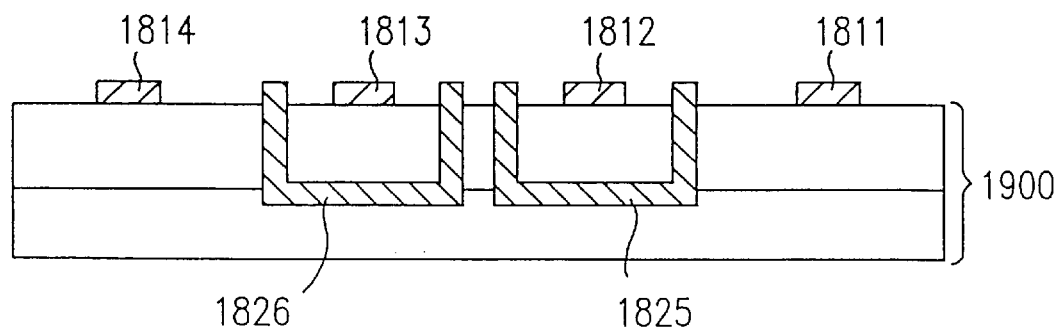
FIG. 20 is a cross-sectional view of the circuit board shown in FIG. 19.

When the divider/combiner shown in FIG. 18 is mounted on a flat circuit board, the transmission lines 1812 and 1813 should be formed so as not to cross the transmission lines 1825 and 1826, respectively. FIG. 19 is a diagram showing a circuit board configuration of the divider/combiner of the ninth example shown in FIG. 18. In FIG. 19, only the portion in the vicinity of the node 1806 is shown, whereas the node 1801 and the surrounding portion thereof are not shown. FIG. 20 is a cross-sectional view of the circuit board used for the divider/combiner of the ninth example shown in FIG. 19. FIG. 20 is taken along the broken line A—A' shown in FIG. 19.

As shown in FIGS. 19 and 20, transmission lines 1811 to 1814 and 1825 and 1826 are formed on the surface of a multi-layer circuit board 1900 having a dielectric constant of about 10.5. Also, surface mounting type resistors 1821 to 1824 and capacitors 1827 and 1827 are further mounted on the multi-layer circuit board 1900. Each of the transmission lines 1825 and 1826 is partially formed so as to be embedded in the inner layers of the circuit board 1900. The capacitors 1827 and 1828 are serially inserted into the transmission lines 1825 and 1826, respectively. By forming a part of the transmission line 1825 and a part of the transmission line 1826 in the inner layers of the circuit board 1900, the divider/combiner shown in FIG. 18 can be implemented on a flat circuit board.

Figure 21:
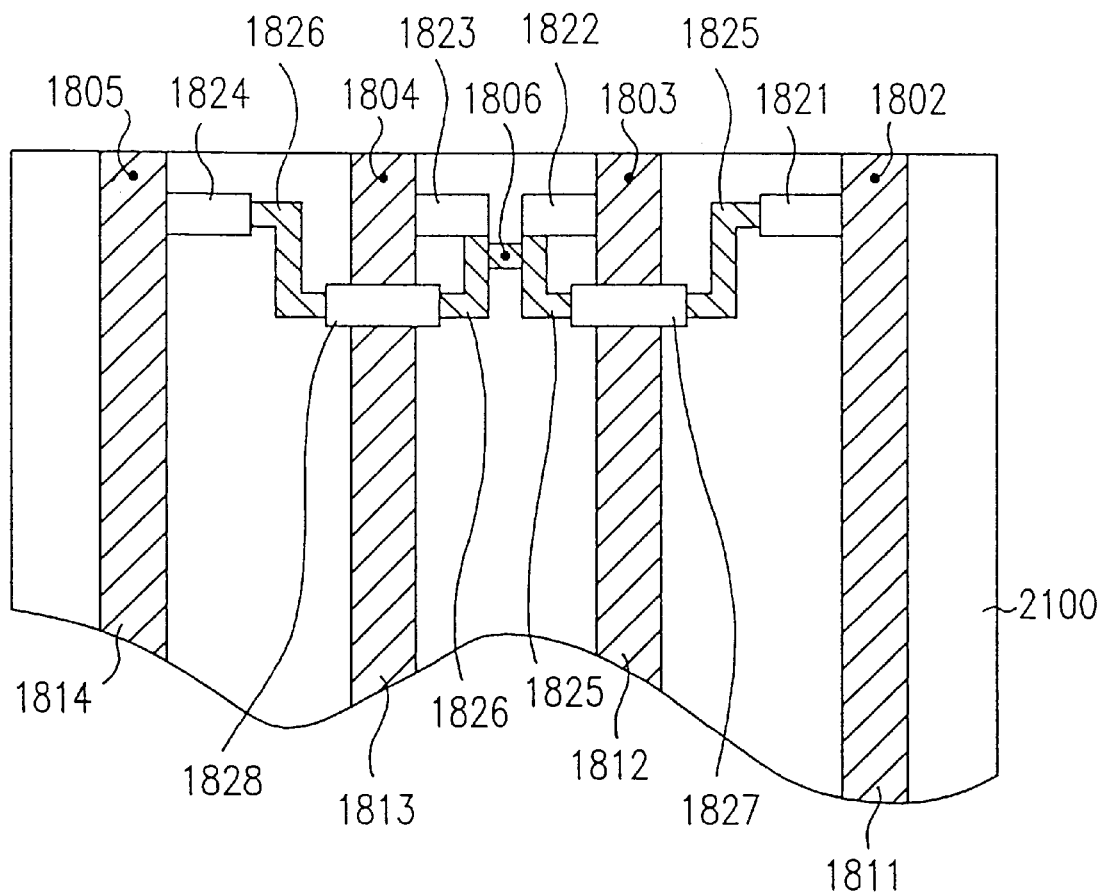
FIG. 21 is a diagram showing another circuit board configuration or the divider/combiner of the ninth example shown in FIG. 18.

FIG. 21 is a diagram showing another circuit board configuration of the divider/combiner of the ninth example shown in FIG. 18. In FIG. 21, the ninth example is implement using a single-layer circuit board 2100. As shown in FIG. 21, the capacitors 1827 and 1828 are mounted over the transmission lines 1812 and 1813, respectively such that the transmission lines 1812 and 1813 do not cross the transmission lines 1825 and 1826, respectively. Alternatively, the same effects may also be attained if the resistors 1821 and 1824 respectively connected to the transmission lines 1825 and 1826 are mounted over the transmission lines 1812 and 1813, respectively.

EXAMPLE 10

Each of the dividers/combiners of the following tenth to fifteenth examples of the present invention includes a divider, an amplifier element and a combiner. The divider receives an RF signal at a single node and then divides the received signal. The amplifier element amplifies the divided signals. The combiner combines the amplified signals and then outputs the combined signal at a single node. Any of the dividers/combiners of the foregoing examples may be used as the divider and the combiner of the following examples.

Figure 22:
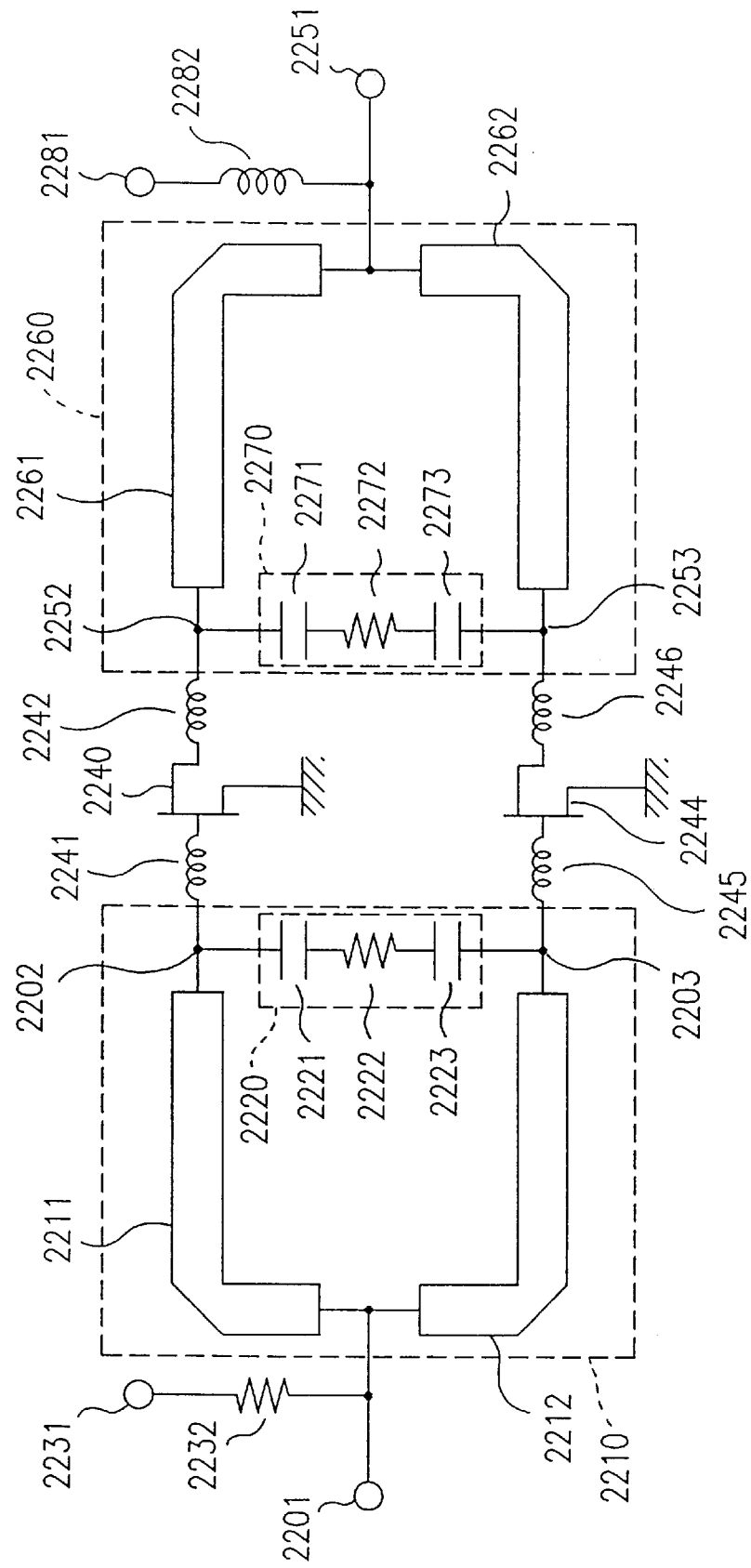
FIG. 22 is a circuit diagram of a divider/combiner in the tenth example of the present invention.

FIG. 22 is a circuit diagram of a divider/combiner in the tenth example of the present invention. In the tenth to fifteenth examples, the circuit receives a signal at a single node and outputs a combined signal at a single node. However, since the circuit includes a divider and a combiner, such a circuit will also be referred to as a "divider/combiner" for convenience.

A divider 2210 receives an RF signal at a node 2201, divides the received RF signal and then outputs the divided signals to nodes 2202 and 2203. Inductors 2241 and 2245 connect the nodes 2202 and 2203 to the gates of the FETs 2240 and 2244, respectively. The FETs 2240 and 2244 amplify the RF signals received at the respective gates and then output the amplified signals to nodes 2252 and 2253 via inductors 2242 and 2246, respectively. A combiner 2260 receives the amplified RF signals at the nodes 2252 and 2253, combines these signals and then outputs a combined signal at a node 2251.

A gate bias voltage is commonly supplied from a node 2231 via a resistor 2232 to the FETs 2240 and 2244. A drain bias voltage is commonly supplied from a node 2281 via an inductor 2282 to the FETs 2240 and 2244. The nodes 2201 and 2251 are terminated at about 50 Ω. In this tenth example, the divider/combiner 300 described in the first example is used as each of the divider 2210 and the combiner 2260. It is noted that the divider 2210 and the combiner 2260 shown in FIG. 22 also satisfy the resistance/reactance symmetry. Moreover, the divider 2210 and the combiner 2260 can also realize the impedance matching and the isolation in the same way as in the first example.

The divider 2210 and the combiner 2260 include a pair of transmission lines 2211 and 2212 and a pair of transmission lines 2261 and 2262, respectively, each of the pairs being provided on a circuit board having a dielectric constant of about 10.5 and a thickness of about 0.78 mm. The transmission lines 2211 and 2212 and the transmission lines 2261 and 2262 have a length of about 25 mm, a width of about 1.8 mm, a characteristic impedance of about 30 Ω and an electrical length of about 5λ/24 at a frequency of about 1 GHz.

The FETs 2240 and 2244 are GaAs MES (metal-semiconductors) FETs in which a channel layer is formed by performing an ion implantation of silicon onto a semi-insulating gallium arsenide (GaAs) substrate and have a total gate width of about 4 mm. The gate electrodes of the FETs 2240 and 2244 are connected to the nodes 2202 and 2203 of the divider 2210 via the inductors 2241 and 2245, respectively, while the drain electrodes of the FETs 2240 and 2244 are connected to the nodes 2252 and 2253 of the combiner 2260 via the inductors 2242 and 2246, respectively. In this example, the inductors 2241, 2242, 2245 and 2246 do not represent the coils to be mounted as discrete components but represent inductances included in bonding wires for connecting the FETs 2240 and 2244.

At a frequency of about 1 GHz, the input impedances of the FETs 2240 and 2244 viewed from the nodes 2202 and 2203, respectively, are about (10+j12) Ω, while the output impedances of the FETs 2240 and 2244 viewed from the nodes 2252 and 2253, respectively, are about (15+j12) Ω. These input and output impedances are inductive (i.e., the impedances are located in the second quadrant of a Smith chart). This is because the bonding wires functioning as the inductors 2241, 2242, 2245 and 2246 are relatively long.

As described in the first example, the divider 2210 is characterized in that, even when an inductive impedance is connected between the nodes 2202 and 2203, the isolation can be secured between the nodes 2202 and 2203. Similarly, the combiner 2260 is characterized in that, even when an inductive impedance is connected between the nodes 2252 and 2253, the isolation can be secured between the nodes 2252 and 2253. Thus, in this example, an interaction can be advantageously eliminated from between the input and output nodes (i.e., the gate and the source) of the FETs 2240 and 2244. As a result, in the divider/combiner of the tenth example in which a plurality of FETs are connected in parallel for amplifying an RF signal, effects can be attained in that the impedances of the diver and the combiner viewed from the respective FETs are not varied and that the parallel operation of the FETs is not adversely affected. Furthermore, in the divider/combiner of the tenth example, even when the FETs 2240 and 2244 have different characteristics, a satisfactory power division/combination efficiency can be maintained. Consequently, the divider/combiner of this example can advantageously secure a high production yield when such dividers/combiners are mass-produced.

It is noted that a simplified divider/combiner where one of the phase shifters 2220 and 2270 is omitted is also included within the scope of the present invention. In other words, at least one of the divider 2210 and the combiner 2260 is required to include a phase shifter. However, in order to accomplish a more complete isolation, both of the phase shifters 2220 and 2270 are preferably provided. This fact is also true of the following eleventh to fifteenth examples.

EXAMPLE 11

Figure 23:
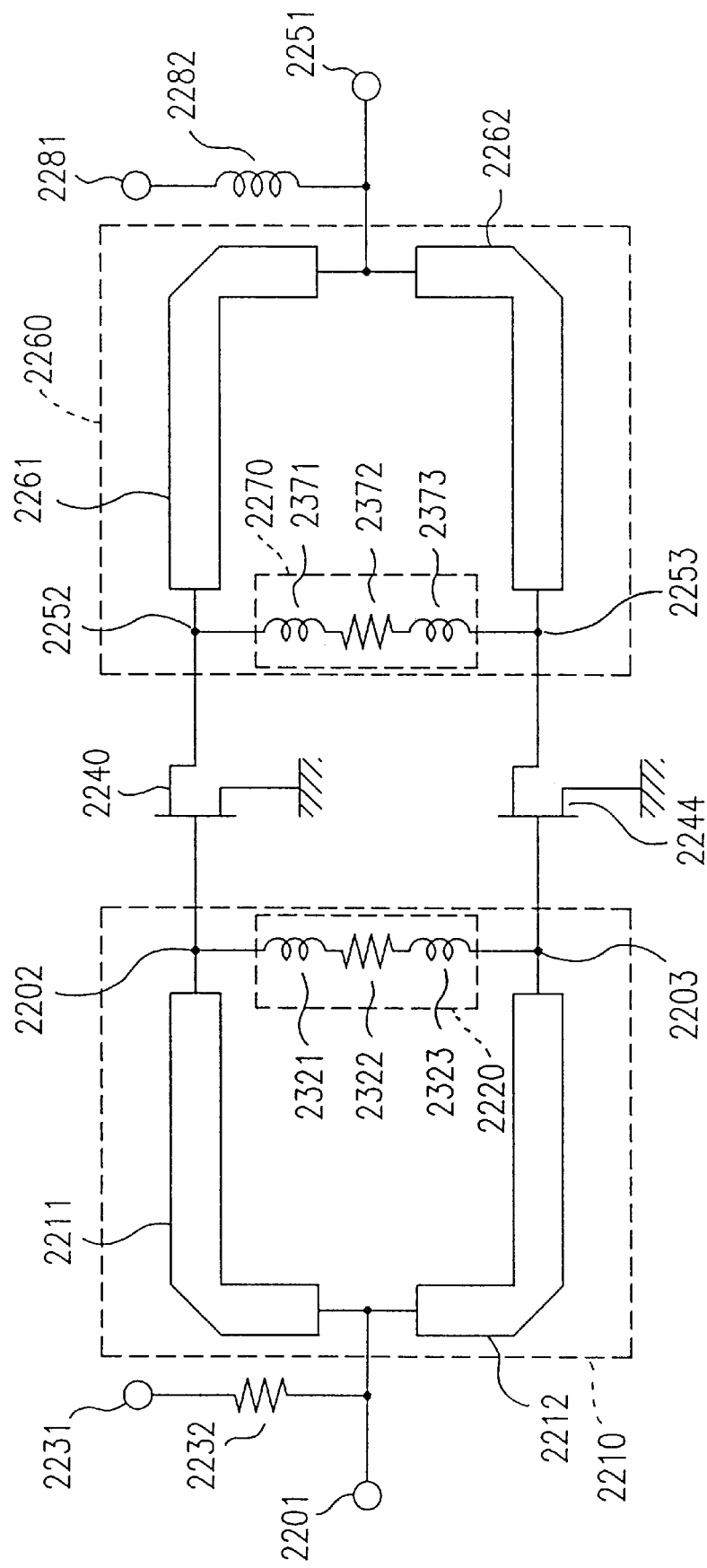
FIG. 23 is a circuit diagram of a divider/combiner in the eleventh example of the present invention.

FIG. 23 is a circuit diagram of a divider/combiner in the eleventh example of the present invention. The divider/combiner of the eleventh example is the same as the divider/combiner of the tenth example except that the divider 2210 and the combiner 2260 of the eleventh example include inductors instead of the capacitors. In this example, the inductances of the bonding wires respectively connecting the gates of the FETs 2240 and 2244 to the nodes 2202 and 2203 and the drains of the FETs 2240 and 2244 to the nodes 2252 and 2253 are assumed to be small enough to be negligible. It is noted that the divider 2210 and the combiner 2260 shown in FIG. 23 also satisfy the resistance/reactance symmetry. Moreover, the divider 2210 and the combiner 2260 can also realize the impedance matching and the isolation in the same way as in the first example.

The divider 2210 and the combiner 2260 include a pair of transmission lines 2211 and 2212 and a pair of transmission lines 2261 and 2262, respectively, each of the pairs being provided on a circuit board having a dielectric constant of about 10.5 and a thickness of about 0.78 mm. The transmission lines 2211 and 2212 and the transmission lines 2261 and 2262 have a length of about 35 mm, a width of about 1.8 mm, a characteristic impedance of about 30 Ω and an electrical length of about 7λ/24 at a frequency of about 1 GHz.

At a frequency of about 1 GHz, the input impedances of the FETs 2240 and 2244 as viewed from the nodes 2202 and 2203, respectively, are about (10-j12) Ω, while the output (impedances of the FETs 2240 and 2244 as viewed from the nodes 2252 and 2253, respectively, are about (15-j12). These input and output impedances are capacitive (i.e., the impedances are located in the third quadrant of a Smith chart).

As described in the third example, even when a capacitive impedance is connected between the nodes 2202 and 2203, the isolation can be secured between the nodes 2202 and 2203 in the divider 2210. Similarly, even when a capacitive impedance is connected between the nodes 2252 and 2253, the isolation can be secured between the nodes 2252 and 2253 in the combiner 2260. Thus, in this example, effects can also be attained in that the impedances of the divider and the combiner as viewed from the respective FETs are not varied and that the parallel operation of the FETs is not adversely affected, in the same way as in the tenth example. Furthermore, in the divider/combiner of the eleventh example, even when the FETs 2240 and 2244 have different characteristics, a satisfactory power division/combination efficiency can be maintained. Consequently, the divider/combiner of this example can advantageously secure a high production yield when such dividers/combiners are mass-produced.

EXAMPLE 12

Figure 24:
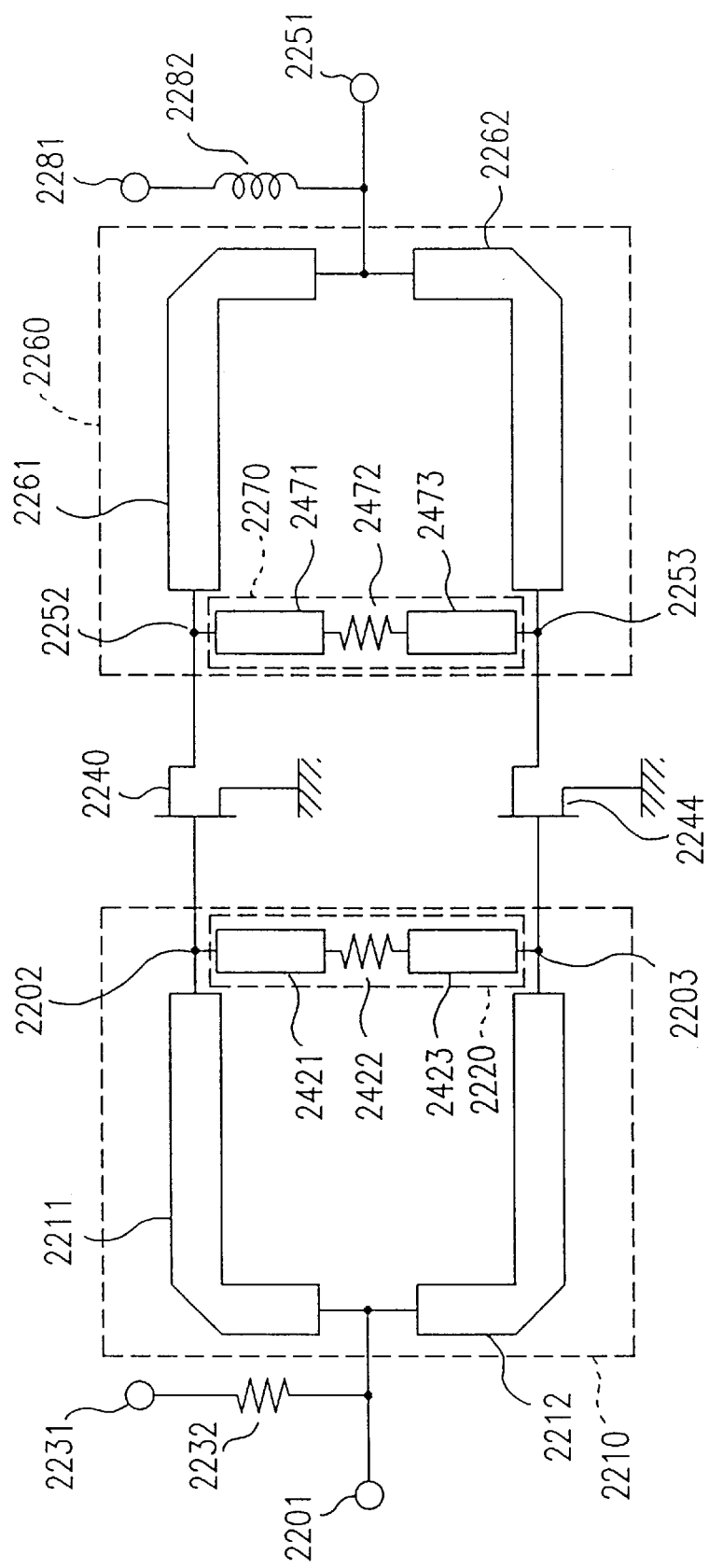
FIG. 24 is a circuit diagram of a divider/combiner in the twelfth example of the present invention.

FIG. 24 is a circuit diagram of a divider/combiner in the twelfth example of the present invention. The divider/combiner of the twelfth example is the same as the divider/combiner of the eleventh example except that the phase shifters 2220 and 2270 of the twelfth example include transmission lines instead of the inductors. More specifically, the phase shifter 2220 includes a transmission line 2421, a resistor 2422 and a transmission line 2423 which are serially connected in this order, while the phase shifter 2270 includes a transmission line 2471, a resistor 2472 and a transmission line 2473 which are serially connected in this order. It is noted that the divider 2210 and the combiner 2260 shown in FIG. 24 also satisfy the resistance/reactance symmetry. Moreover, the divider 2210 and the combiner 2260 can also realize the impedance matching and the isolation in the same way as in the first example.

The same effects as those attained by the divider/combiner of the eleventh example can also be attained by the divider/combiner of the twelfth example by using the following exemplary parameters:

Resistance of resistor 2422: about 20 Ω;
Resistance of resistor 2472: about 30 Ω;
Characteristic impedances of transmission lines 2421, 2423, 2471 and 2473: about 30 Ω;
Lengths of transmission lines 2421, 2423, 2471 and 2473: about λ/24;
Characteristic impedances of transmission lines 2211, 2212, 2261 and 2262: about 30 Ω; and
Lengths of transmission lines 2211, 2212, 2261 and 2262: about 7λ/24 (>λ/4).

EXAMPLE 13

Figure 25:
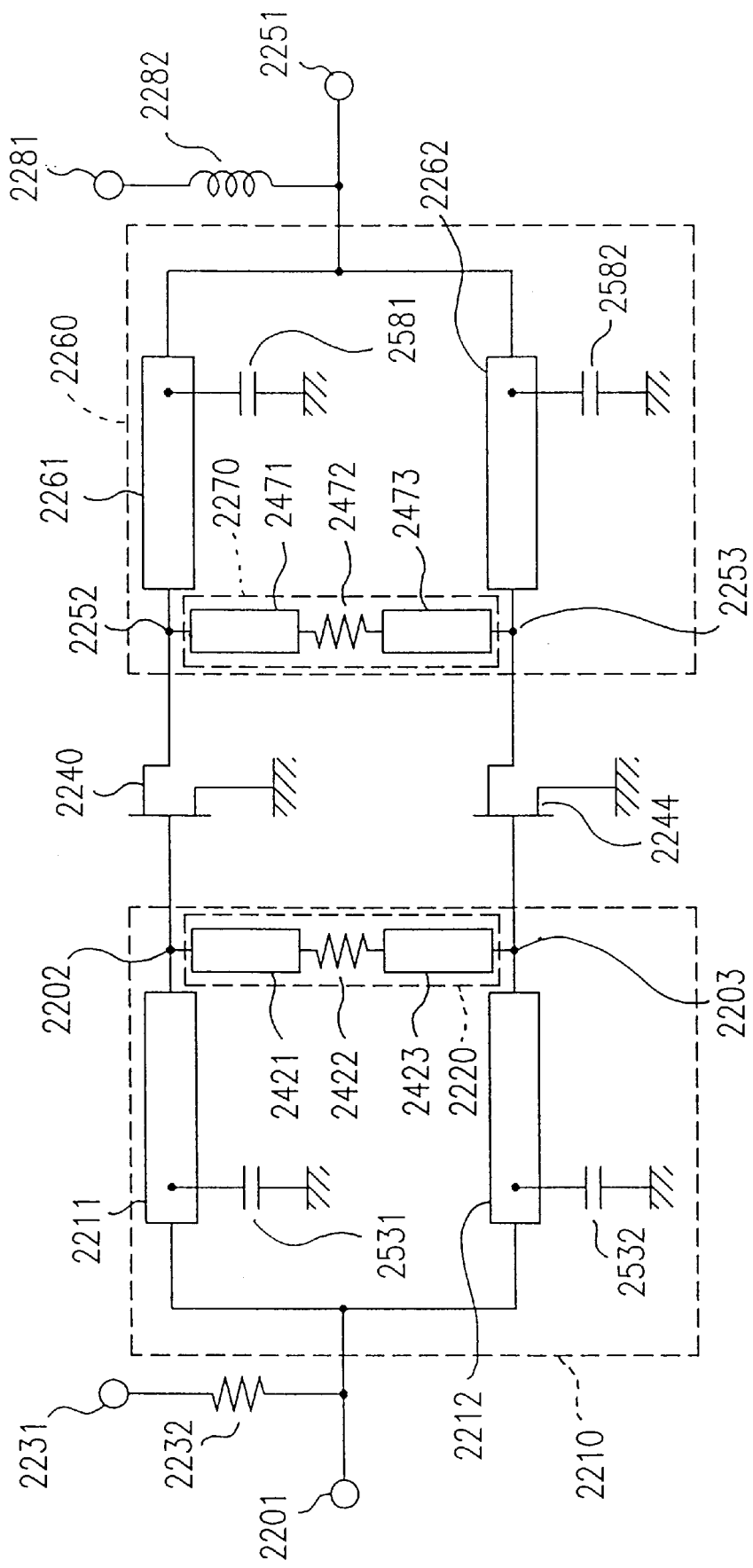
FIG. 25 is a circuit diagram of a divider/combiner in the thirteenth example of the present invention.

FIG. 25 is a circuit diagram of a divider/combiner in the thirteenth example of the present invention. The divider/combiner of the thirteenth example is the same as the divider/combiner of the twelfth example except that capacitors 2531, 2532, 2581 and 2582 are connected between a point in a transmission line 2211 and a ground, between a point in a transmission line 2212 and a ground, between a point in a transmission line 2261 and a ground and between a point in a transmission line 2262 and a ground, respectively. It is noted that the divider 2210 and the combiner 2260 shown in FIG. 25 also satisfy the resistance/reactance symmetry. Moreover, the divider 2210 and the combiner 2260 can also realize the impedance matching and the isolation in the same way as in the first example.

The divider 2210 and the combine 2260 include a pair of transmission lines 2211 and 2212 and a pair of transmission lines 2261 and 2262, respectively, each of the pairs being provided on a circuit board having a dielectric constant of about 10.5 and a thickness of about 0.78 mm. The transmission lines 2211 and 2212 and the transmission lines 2261 and 2262 have a length of about 15 mm and a width of about 0.675 mm. The capacitances of the capacitors 2531, 2532, 2581 and 2582 are about 4.5 pF. The lengths of the transmission lines 2211, 2212, 2261 and 2262 of the twelfth example are about 35 mm, whereas those of the transmission lines of the thirteenth example are about 15 mm.

In this example, by shifting the phases by the capacitors 2531, 2532, 2581 and 2582, the length of the transmission lines 2211, 2213, 2261 and 2262 of the twelfth example are shortened to be less than ½. The isolation characteristics between the nodes 2202 and 2203 are substantially the same as those described in the twelfth example. The lengths of the transmission lines 2211, 2212, 2261 and 2262 determine the size of the mounted divider/combiner. Thus, in this example, by providing the capacitors for the transmission lines such that the other terminals of the capacitors are grounded, the size of the divider/combiner can be advantageously reduced by about ½, while realizing similar characteristics to those attained by the twelfth example.

Figure 26:
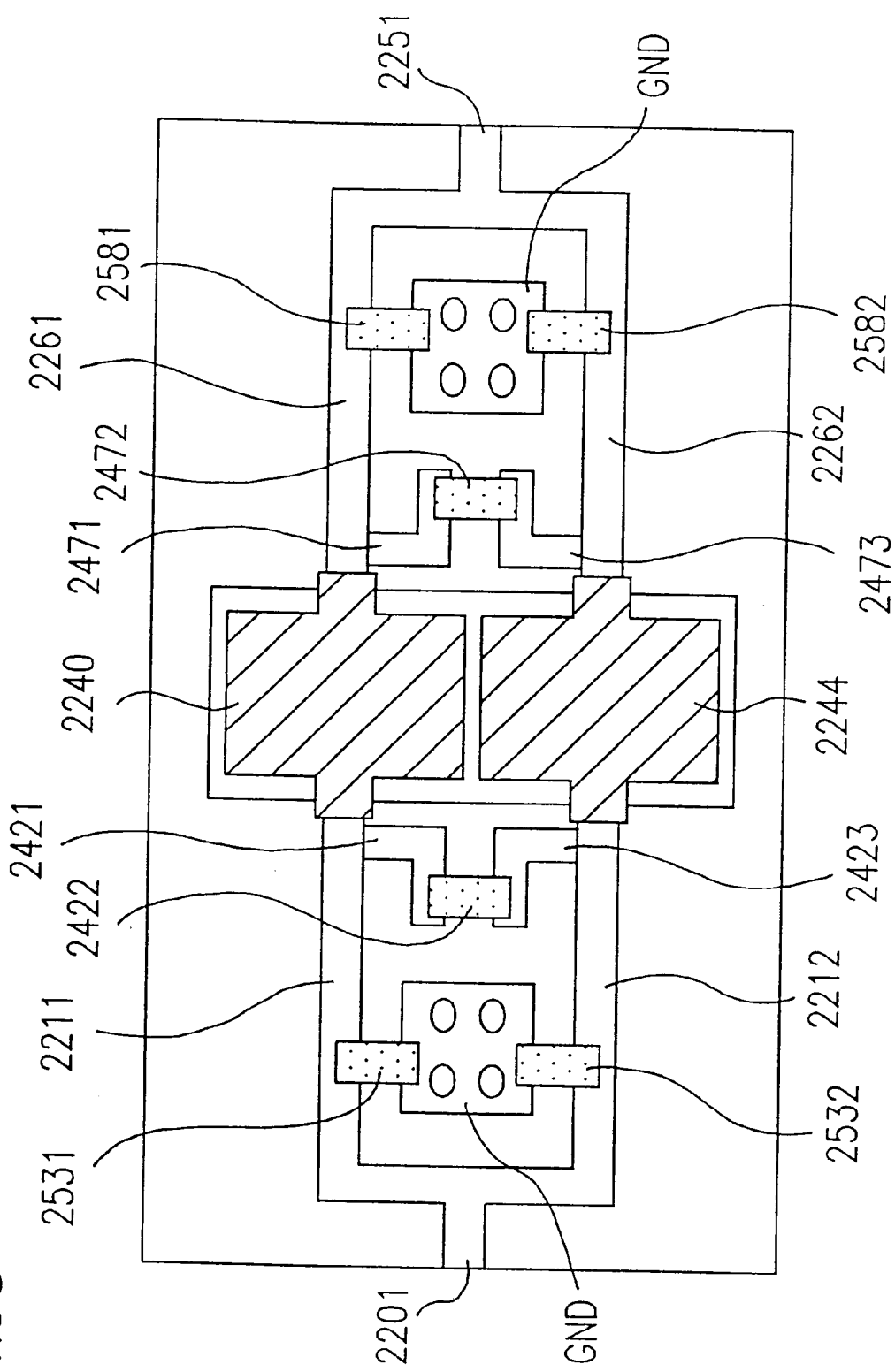
FIG. 26 is a diagram showing a circuit board configuration of the divider/combiner shown in FIG. 25.

FIG. 26 is a diagram showing a circuit board configuration of the divider/combiner shown in FIG. 25. In FIG. 26, GND denotes a ground, and the patterns for gate biasing and drain biasing are omitted.

EXAMPLE 14

Figure 27:
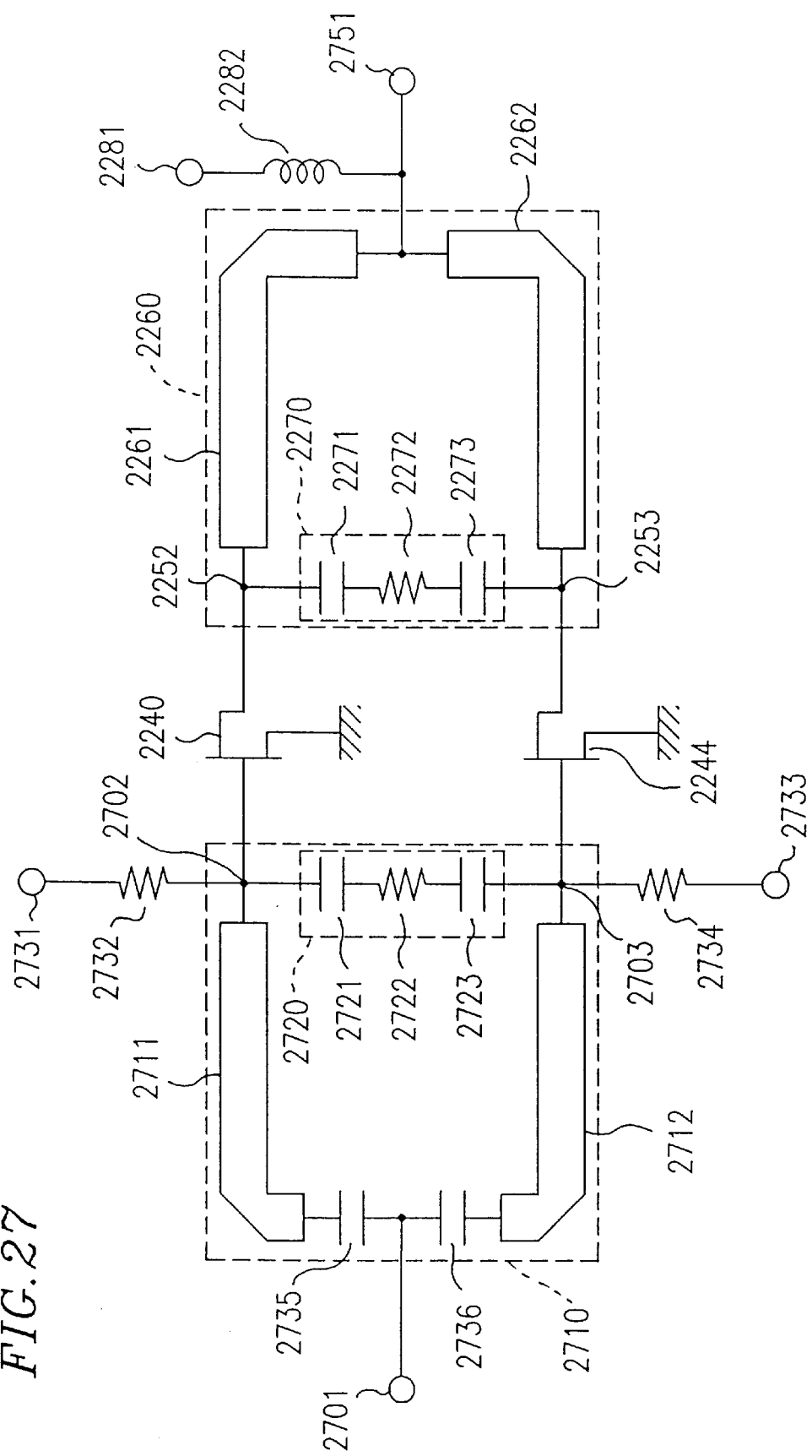
FIG. 27 is a circuit diagram of a divider/combiner in the fourteenth example of the present invention.

FIG. 17 is a circuit diagram of a divider/combiner in the fourteenth example of the present invention. The divider/combiner of the fourteenth example is different from the divider/combiner of the tenth example in that serially connected capacitors 2735 and 2736 are inserted between a node 2701 and transmission lines 2711 and 2712 and that gate bias voltages are respectively supplied from nodes 2731 and 2733 via resistors 2732 and 2734 to the FETs 2240 and 2244 operating in parallel. It is noted that the divider 2210 and the combiner 2260 shown in FIG. 27 also satisfy the resistance/reactance symmetry. Moreover, the divider 2210 and the combiner 2260 can also realize the impedance matching and the isolation in the same way as in the first example.

In the tenth example, a gate bias voltage is supplied through a common node 2231 to the FETs 2240 and 2244 operating in parallel. Thus, in the case of operating in parallel in FETs having different threshold voltages, it is probable that the FET 2240 operates in a class A, whereas the FET 2244 operates in a class B. When such imbalanced parallel operations are performed, the output power and efficiency are possibly degraded. In addition, such operations possibly deteriorate the distortion characteristics. In order to prevent such an imbalance, pairs of FETs having completely the same threshold voltage are required to be used. It is trouble some to select such FETs.

On the other hand, in this example, since the nodes 2702 and 2703 are direct current (dc) isolated, the gate voltages of the FETs 2240 and 2244 operating in parallel can be separately set. As a result, even when the FETs 2240 and 2244 have different threshold voltages, the FETs 2240 and 2244 can be operated in parallel at the same operating point. By setting the capacitance values of the capacitors 2735 and 2736 to be sufficently large with respect to the operating frequency each that the reactance of the capacitors 2735 and 2736 become small enough to be negligible, the length of the transmission lines 2711 and 2712 may be set equal to the lengths of the transmission lines 2211 and 2212 of the tenth example.

In addition, if FETs having different gate widths are used as the FETs operating in parallel, then FETs having an optimum gate width can be selectively operated in accordance with the level of an output power. Consequently, the efficiency can be maximized in accordance with the level of the output power.

EXAMPLE 15

Figure 28:
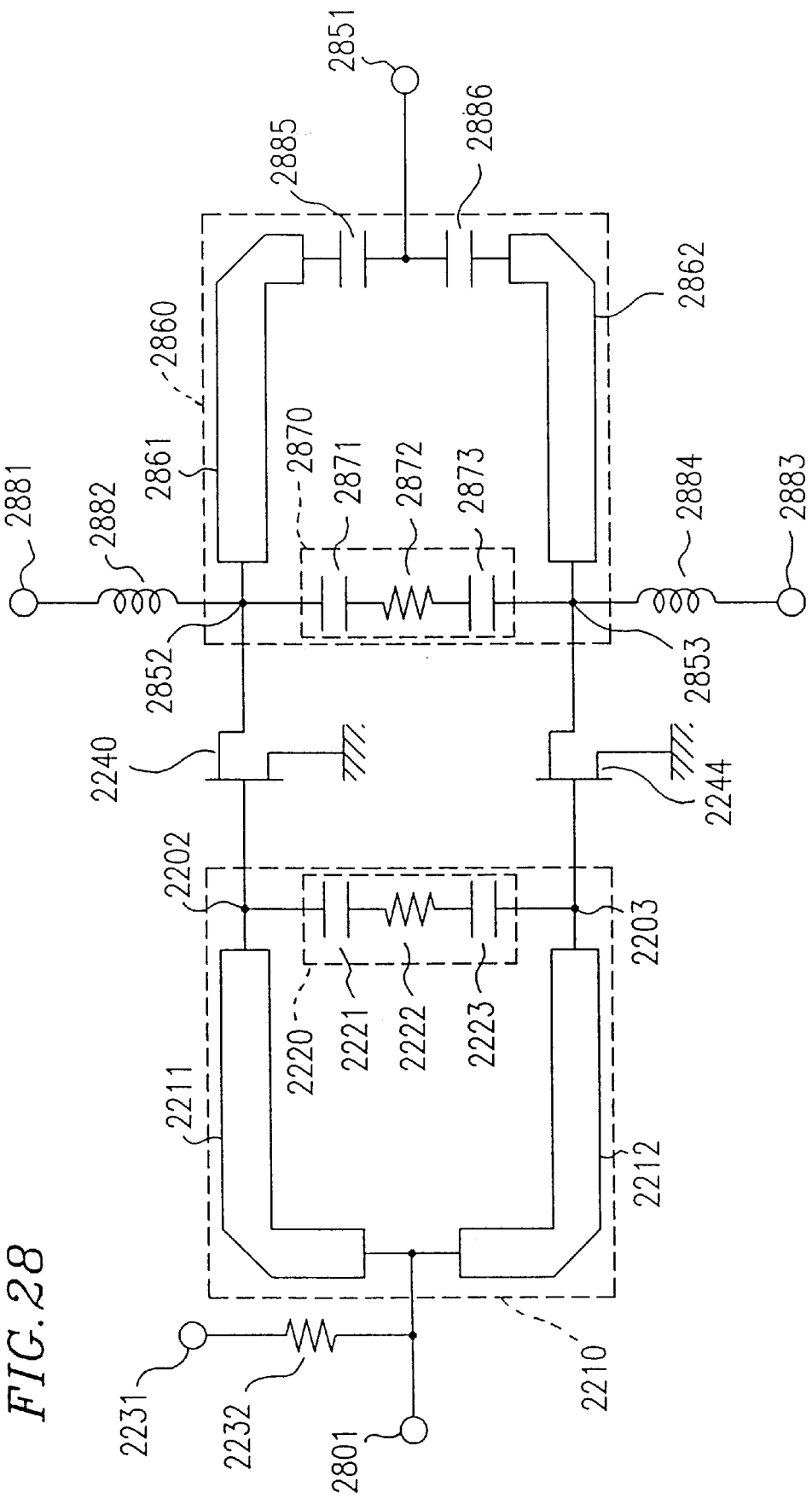
FIG. 28 is a circuit diagram of a divider/combiner in the fifteenth example of the present invention.

FIG. 28 is a circuit diagram of a divider/combiner in the fifteenth example of the present invention. The divider/combiner of the fifteenth example is different from the divider/combiner of the tenth example in that serially connected capacitors 2885 and 2886 are inserted between a node 2851 and transmission lines 2861 and 2862 and that drain bias voltages are respectively supplied from nodes 2881 and 2883 via inductors 2882 and 2884 to the FETs 2240 and 2244 operating in parallel. It is noted that the divider 2210 and the combiner 2260 shown in FIG. 28 also satisfy the resistance/reactance symmetry. Moreover, the divider 2210 and the combiner 2260 can also realize the impedance matching and the isolation in the same way as in the first example.

In the tenth example, a drain bias voltage is supplied through a common node 2281 to the FETs 2240 and 2244 operating in parallel. Thus, even when all the FETs are not necessarily required to be operated in parallel (e.g., when a required output power is small), a drain bias voltage is always applied uniformly to all the FETs. Thus, depending upon the magnitude of the output power, current exceeding a required amount is adversely consumed. Particularly when the operation of the FETs 2240 and 2244 is set in a class A, such a tendency becomes more remarkable.

On the other hand, in this example, since the two nodes 2852 and 2853 are dc isolated, the drain voltages of the FETs 2240 and 2244 operating in parallel can be individually set. Moreover, depending upon the magnitude of the output power, the drain voltage may be selectively supplied to the FETs desired to be operated. In spite of such an imbalanced operation state, the isolation can be secured between the two nodes 2852 and 2853. Thus, when either one of the FETs 2240 and 2244 is operated, constant RF power can be output. Consequently, as compared with a conventional case, it is possible to considerably improve the efficiency corresponding to small output power without sacrificing the characteristics corresponding to the maximum output power. Such a tendency becomes more remarkable as the number of FETs operating in parallel becomes larger.

In addition, if FETs having different gate widths are used as the FETs operating in parallel, then FETs having an optimum gate width can be selectively operated in accordance with the level of an output power. Consequently, the efficiency can be maximized in accordance with the level of the output power.

In the fourteenth and the fifteenth examples, all of the capacitors 2735, 2736 2885 and 2886 are serially connected to the corresponding transmission lines at the respective and points thereof. However, the connection points are not limited thereto, but these capacitors may be serially connected to the corresponding transmission lines at the respective middle points thereof. For example, in the configuration shown in FIG. 27, each of the transmission lines 2711 and 2712 may be divided into two transmission line parts at the middle point thereof. In such a case, the capacitor 2735 may be inserted between the two transmission line parts of the transmission lines 2711 and the capacitor 2736 may be inserted between the two transmission line parts of the transmission line 2712. Such a modification is also applicable to the circuit shown in FIG. 28

In the foregoing tenth to the fifteenth examples, the divider/combiner performs a 1-N division and an N-1 combination (where N=2). However, the value of N is not limited thereto, but may be equal to or larger than 3.

In all of the foregoing examples, in order to obtain the effects to be attained by the present invention, the resistance of the phase shifter is preferably located between points having substantially equal phases with respect to one node (e.g., a node 302) and to the other node (e.g., a node 303) among a plurality of nodes. In addition, it is more preferable that the distributions of the resistance and the reactance as viewed from one (e.g., a node 302) of a plurality of nodes are substantially equal to the distributions of the resistance and the reactance as viewed from the other node (e.g., a node 303) among the plurality of nodes.

According to the present invention, at least the following advantageous effects can be attained.

(1) Even when a node for receiving an input signal is terminated at a pure resistance of about 50 Ω and a node for providing an output signal is terminated at an impedance existing in the second quadrant of a Smith chart excluding the real axis thereof, the impedance matching and the isolation can be simultaneously realized by controlling the phases by means of phase shifters.

(2) Since an isolation can be secured between the gate and the drain of each of the FETs operating in parallel, even when the FETs operating in parallel have different characteristics, a satisfactory power division/combination efficiency can be maintained and it is possible to eliminate an adverse effect resulting from the interaction between the FETs.

(3) The gate voltages of a plurality of FETs operating in parallel can be separately set. Thus, even when the FETs have different threshold values, the FETs can be operated in parallel at the same operating point. As a result, the troublesome procedure of selecting usable FETs based on the threshold voltages thereof can be eliminated.

(4) It becomes significantly easier to equalize the lengths of the respective lines in a 1-N division/N-1 combination divider/combiner (where N is an integer equal to or larger than 3) so that various kinds of restrictions on the layouts of a circuit can be considerably alleviated.

(5) Even if the distance between the output nodes cannot be neglected with respect to the frequency used, satisfactory isolation characteristics are realized by inserting transmission lines and capacitors into the section between the output nodes.

Various other modifications will be apparent to and can be radily made by those skilled in the art without departing from the scope and spirit of this invention. Accordingly, it is not intended that the scope of the claims appended hereto be limited to the description as set forth herein, but rather that the claims be broadly construed.

What is claimed is:

1. A divider/combiner, comprising:

a first node;

a second node;

a third node;

a first transmission line electrically coupled to the first node and to the second node;

a second transmission line electrically coupled to the first node and to the third node; and an adjusting circuit being electrically coupled to the second node and to the third node and having a resistance and a reactance, wherein the resistance is located between points having a substantially equal phases with respect to the second node and to the third node, respectively, the second node and the third node are respectively connected to an impedance having and imaginary component, and each of an electrical length of the first transmission line and an electrical length of the second transmission line has a predefined value not equal to $N\lambda/4$, where $\lambda$ is a wavelength of an operating frequency of the divider/combiner, and N is an integer, and wherein the adjusting circuit has a capacitance as the reactance and comprises a first capacitor, a first resistor and a second capacitor which are serially connected in this order.

2. A divider/combiner, comprising:

a first node;

a second node;

a third node;

a first transmission line electrically coupled to the first node and to the second node;

a second transmission line electrically coupled to the first node and to the third node; and an adjusting circuit being electrically coupled to the second node and to the third node and having a resistance and a reactance, wherein the resistance is located between points having a substantially equal phases with respect to the second node and to the third node, respectively, the second node and the third node are respectively connected to an impedance having an imaginary component, and each of an electrical length of the first transmission line and an electrical length of the second transmission line has a predefined value not equal to $N\lambda/4$, where $\lambda$ is a wavelength of an operating frequency of the divider/combiner, and N is an integer, and wherein the adjusting circuit has a capacitance as the reactance and comprises a fourth node, a first capacitor, a first resistor and a second resistor, and wherein the first capacitor and first resistor, which are serially connected to each other, connect the second node to the fourth node, and wherein the second resistor connects the third node to the fourth node.

3. A divider/combiner, comprising:

a first node;

a second node;

a third node;

a first transmission line electrically coupled to the first node and to the second node;

a second transmission line electrically coupled to the first node and to the third node; and an adjusting circuit being electrically coupled to the second node and to the third node and having a resistance and a reactance, wherein the resistance is located between points having substantially equal phases with respect to the second node and to the third node, respectively, the second node and the third node are respectively connected to an impedance having an imaginary component, and each of an electrical length of the first transmission line and an electrical length of the second transmission line has a predefined value not equal to $N\lambda/4$, where $\lambda$ is a wavelength of an operating frequency of the divider/combiner, and N is an integer, and wherein the adjusting circuit has an inductance as the reactance and comprises a first inductor, a resistor and a second inductor which are serially connected in this order.

4. A divider/combiner, comprising:

a first node;

a second node;

a third node;

a first transmission line electrically coupled to the first node and to the second node;

a second transmission line electrically coupled to the first node and to the third node; and an adjusting circuit being electrically to the second node and to the third node and having a resistance and a reactance, wherein the resistance is located between points having substantially equal phases with respect to the second node and to the third node, respectively, the second node and the third node are respectively connected to an impedance having an imaginary component, and each of an electrical length of the first transmission line and an electrical length of the second transmission line has a predefined value not equal to $N\lambda/4$, where $\lambda$ is a wavelength of an operating frequency of the divider/combiner, and N is an integer, and wherein the adjusting circuit has a transmission line as the reactance.

5. A divider/combiner according to claim 4, wherein the adjusting circuit comprises a third transmission line, a resistor and a fourth transmission line which are serially connected in this order.

6. A divider/combiner, comprising:

a first node;

a second node;

a third node;

a first transmission line electrically coupled to the first node and to the second node;

a second transmission lien electrically coupled to the first node and to the third node; and an adjusting circuit being electrically coupled to the second node and to the third node and having a resistance and a reactance, wherein the resistance is located between points having substantially equal phases with respect to the second node and to the third node, respectively, the second node and third node are respectively connected to an impedance having an imaginary component, and each of an electrical length of the first transmission lien and an electrical length of the second transmission line has a predefined value not equal to $N\lambda/4$, where $\lambda$ is a wavelength of an operating frequency of the divider/combiner, and N is an integer, and wherein the adjusting circuit comprises a third transmission line, a first capacitor and a resistor which are serially connected to each other.

7. A divider/combiner according to claim 6, wherein the third transmission line and the first capacitor are serially oscillated at a frequency used.

8. A divider/combiner according to claim 7, wherein the adjusting circuit comprises the third transmission line, the first capacitor, the resistor, a second capacitor and a fourth transmission line which are serially connected in this order.

9. A divider/combiner according to claim 8, wherein the third transmission line and the fourth transmission line are formed on a different surface from a surface on which the first transmission line and the second transmission line are formed.

10. A divider/combiner according to claim 6, wherein at least one on the first capacitor and the resistor is formed so as to cross the third transmission line.

11. A divider/combiner, comprising:

a first node;

a second node;

a third node;

a first transmission line electrically coupled to the first node and to the second node;

a second transmission line electrically coupled to the first node and to the third node; and an adjusting circuit being electrically coupled to the second node and to the third node and having a resistance and a reactance, wherein the resistance is located between points having substantially equal phases with respect to the second node and to the third node, respectively, the second node and the third node are respectively connected to an impedance having an imaginary component, and each of an electrical length of the first transmission line and an electrical length of the second transmission line has a predefined value not equal to $N\lambda/4$, where $\lambda$ is a wavelength of an operating frequency of the divider/combiner, and N is an integer, and further comprising an amplifier for receiving a signal from at least one of the second node and the third node, amplifying the received signal and then outputting the amplified signal, wherein the amplifier comprises a plurality of amplifier elements and a plurality of nodes for supplying a gate voltage to respective gates of the plurality of amplifier elements.

12. A divider/combiner according to claim 11, wherein at least two of the plurality of nodes receive different voltages.

13. A divider/combiner, comprising:

a first node;

a second node;

a third node;

a first transmission line electrically coupled to the first node and to the second node;

a second transmission line electrically coupled to the first node and to the third node; and an adjusting circuit being electrically coupled to the second node and to the third node and having a resistance and a reactance, wherein the resistance is located between points having substantially equal phases with respect to the second node and to the third node, respectively, the second node and the third node are respectively connected to an impedance having an imaginary component, and each of an electrical length of the first transmission line and an electrical length of the second transmission line has a predefined value not equal to $N\lambda/4$, where $\lambda$ is a wavelength of an operating frequency of the divider/combiner, and N is an integer, and further comprising an amplifier for receiving a signal from at least one of the second node and the third node, amplifying the received signal and then outputting the amplified signal, wherein the amplifier comprises a plurality of amplifier elements and a plurality of nodes for supplying a drain voltage to respective drains of the plurality of amplifier elements.

14. A divider/combiner according to claim 13, wherein at least two of the plurality of nodes receive different voltages.

15. A divider/combiner according to one of claim 12 and 14, wherein at least two of the plurality of amplifier elements have at least one of different total gate widths and different total emitter sizes.

16. A divider/combiner comprising:

a first node;

a second node;

a third node;

a first transmission line and a capacitor which are serially connected and electrically coupled to the first node and to the second node;

a second transmission line electrically coupled to the first node and to the third node; and a resistance electrically coupled to the second node and to the third node.

* * * * *